(12) United States Patent
Schrade et al.

(10) Patent No.: US 10,593,879 B2
(45) Date of Patent: Mar. 17, 2020

(54) QUANTUM INFORMATION PROCESSING WITH MAJORANA BOUND STATES IN SUPERCONDUCTING CIRCUITS

(71) Applicants: Constantin Schrade, Cambridge, MA (US); Liang Fu, Winchester, MA (US)

(72) Inventors: Constantin Schrade, Cambridge, MA (US); Liang Fu, Winchester, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 16/244,176

(22) Filed: Jan. 10, 2019

(65) Prior Publication Data

US 2019/0214561 A1   Jul. 11, 2019

Related U.S. Application Data

(60) Provisional application No. 62/633,160, filed on Feb. 21, 2018, provisional application No. 62/615,648, filed on Jan. 10, 2018.

(51) Int. Cl.
*H01L 49/00* (2006.01)
*G06N 10/00* (2019.01)
*B82Y 10/00* (2011.01)

(52) U.S. Cl.
CPC ............ *H01L 49/003* (2013.01); *B82Y 10/00* (2013.01); *G06N 10/00* (2019.01)

(58) Field of Classification Search
None
See application file for complete search history.

(56) References Cited

U.S. PATENT DOCUMENTS

| 2012/0112168 A1 | 5/2012 | Bonderson et al. |
| 2017/0133576 A1 | 5/2017 | Marcus et al. |
| 2017/0141287 A1 | 5/2017 | Barkeshli et al. |

(Continued)

OTHER PUBLICATIONS

Flensberg "Tunneling characteristics of a chain of Majorana bound states." Physical Review B 82.18 (2010): 180516, 6 pages.

(Continued)

*Primary Examiner* — Matthew L Reames
*Assistant Examiner* — Steven B Gauthier
(74) *Attorney, Agent, or Firm* — Smith Baluch LLP

(57) ABSTRACT

In a weak link of two s-wave superconductors (SCs) coupled via a time-reversal-invariant (TRI) topological superconducting (TSC) island, a Josephson current can flow due to Cooper pairs tunneling in and out of spatially separated Majorana Kramers pairs (MKPs), which are doublets of Majorana bound states (MBSs). The sign of the resulting Josephson current is fixed by the joint parity of the four Majorana bound states that make up the MKPs on the TSC island. This parity-controlled Josephson effect can be used as a read-out mechanism for the joint parity in Majorana-based quantum computing. For a TSC island with four terminals, the SC leads can address a Majorana superconducting qubit (MSQ) formed by the charge ground states of the TSC island's terminals. Cooper pair splitting enables single-qubit operations, qubit read-out, as well as two-qubit entangling gates. Hence, TSC islands between SC leads may provide an alternative approach to superconducting quantum computation.

11 Claims, 6 Drawing Sheets

(56) References Cited

U.S. PATENT DOCUMENTS

| | | |
|---|---|---|
| 2018/0053113 A1 | 2/2018 | Lutchyn et al. |
| 2018/0053809 A1 | 2/2018 | Freedman et al. |
| 2019/0220769 A1* | 7/2019 | Pikulin .................. G06N 10/00 |

OTHER PUBLICATIONS

International Search Report and Written Opinion in International Patent Application No. PCT/US19/12964 dated Jun. 27, 2019, 11 pages.

Kitaev, "Unpaired Majorana fermions in quantum wires." Physics-Uspekhi 44.10S (2001): 131, 16 pages.

Liu et al., "Non-abelian majorana doublets in time-reversal-invariant topological superconductors." Physical Review X 4.2 (2014): 021018, 16 pages.

Alicea, "New directions in the pursuit of Majorana fermions in solid state systems." Reports on progress in physics 75.7 (2012): 076501. 37 pages.

Fu et al., "Superconducting proximity effect and Majorana fermions at the surface of a topological insulator." Physical review letters 100.9 (2008): 096407. 4 pages.

Haim et al., Time-reversal-invariant topological superconductivity. arXiv:1809.06863 [cond-mat.mes-hall]. Sep. 18, 2018. 60 pages.

Karzig et al., "Scalable designs for quasiparticle-poisoning-protected topological quantum computation with Majorana zero modes." Physical Review B 95.23 (2017): 235305. 32 pages.

Plugge et al., "Majorana box qubits." New Journal of Physics 19.1 (2017): 012001. 15 pages.

Schrade et al., "Andreev or Majorana, Cooper finds out." arXiv preprint arXiv:1809.06370. Sep. 17, 2018. 8 pages.

Schrade et al., "Majorana Superconducting Qubit." arXiv preprint arXiv:1803.01002. Mar. 2, 2018. 9 pages.

Schrade et al., "Parity-controlled 2Pi Josephson effect mediated by Majorana Kramers pairs." arXiv preprint arXiv:1801.03511. Jan. 10, 2018. 11 pages.

Vijay et al., "Teleportation-based quantum information processing with Majorana zero modes." Physical Review B 94.23 (2016): 235446.

\* cited by examiner

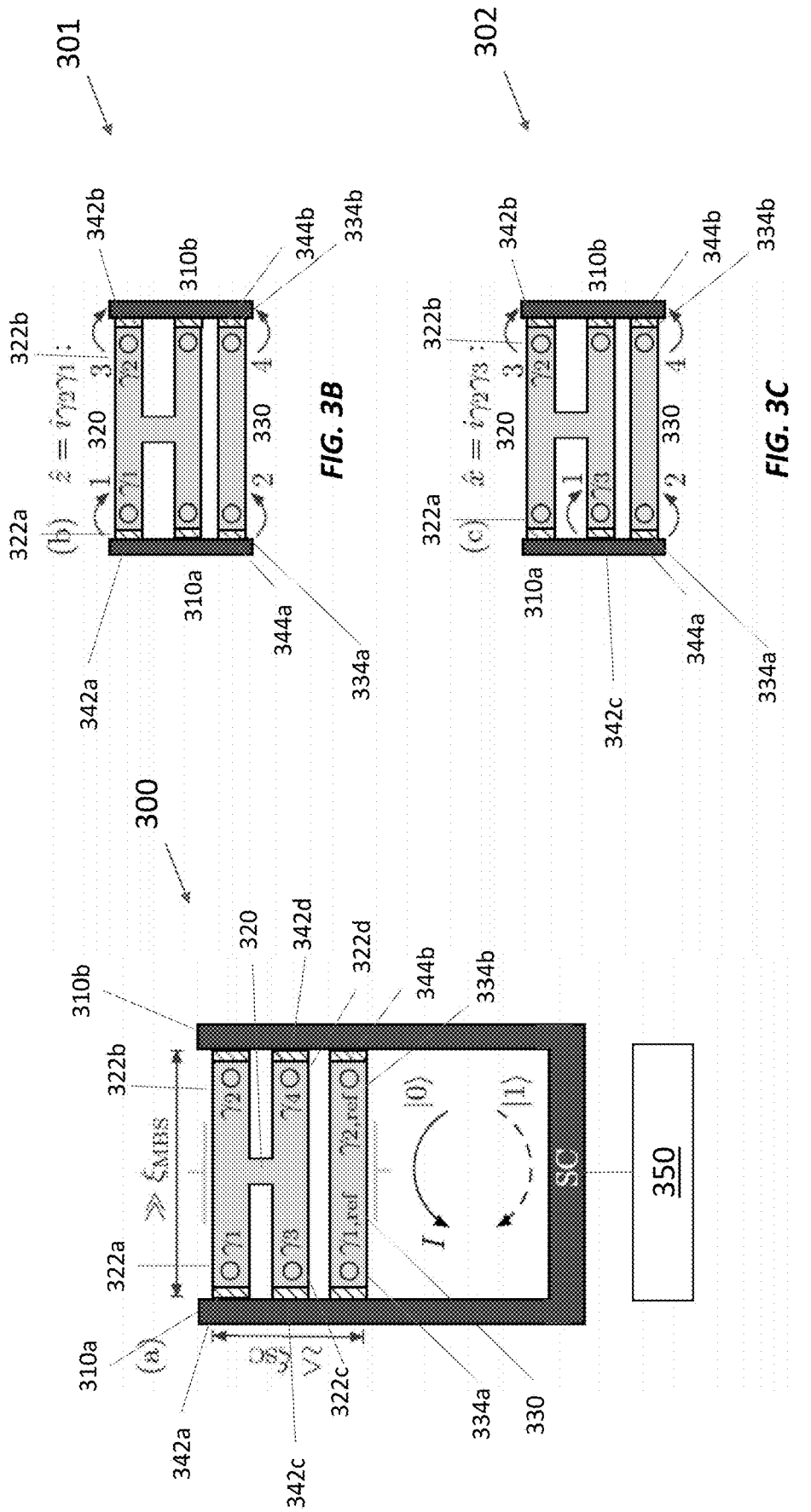

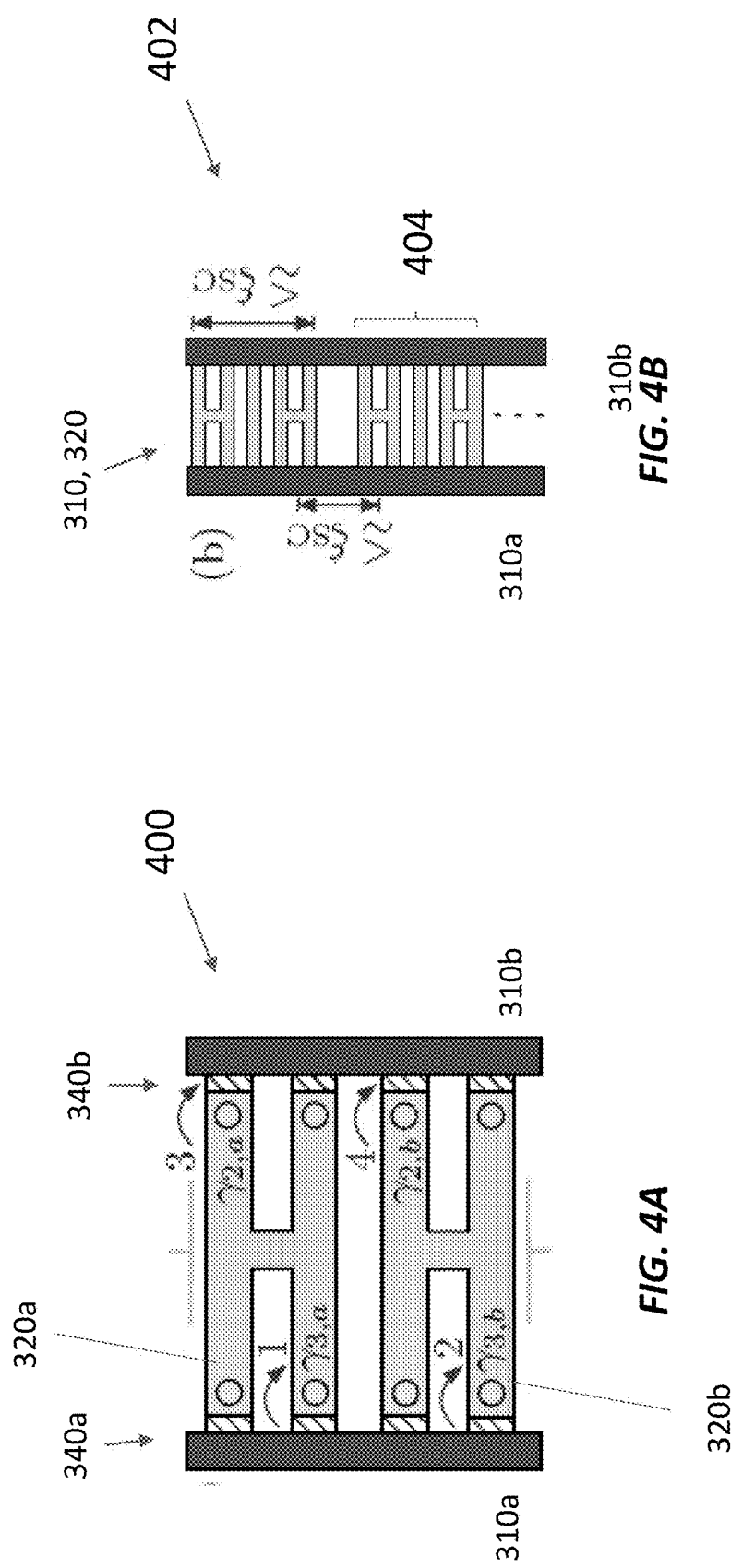

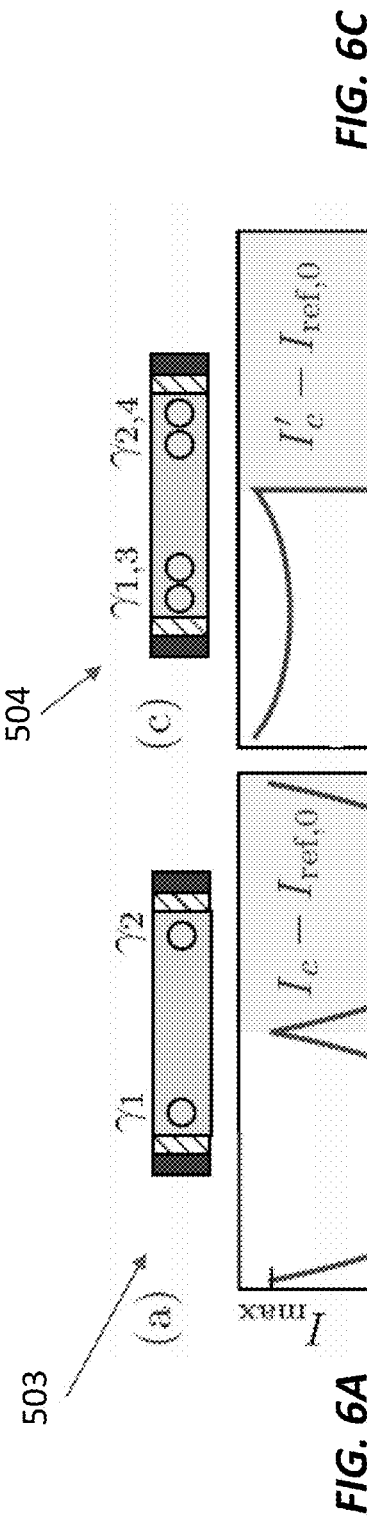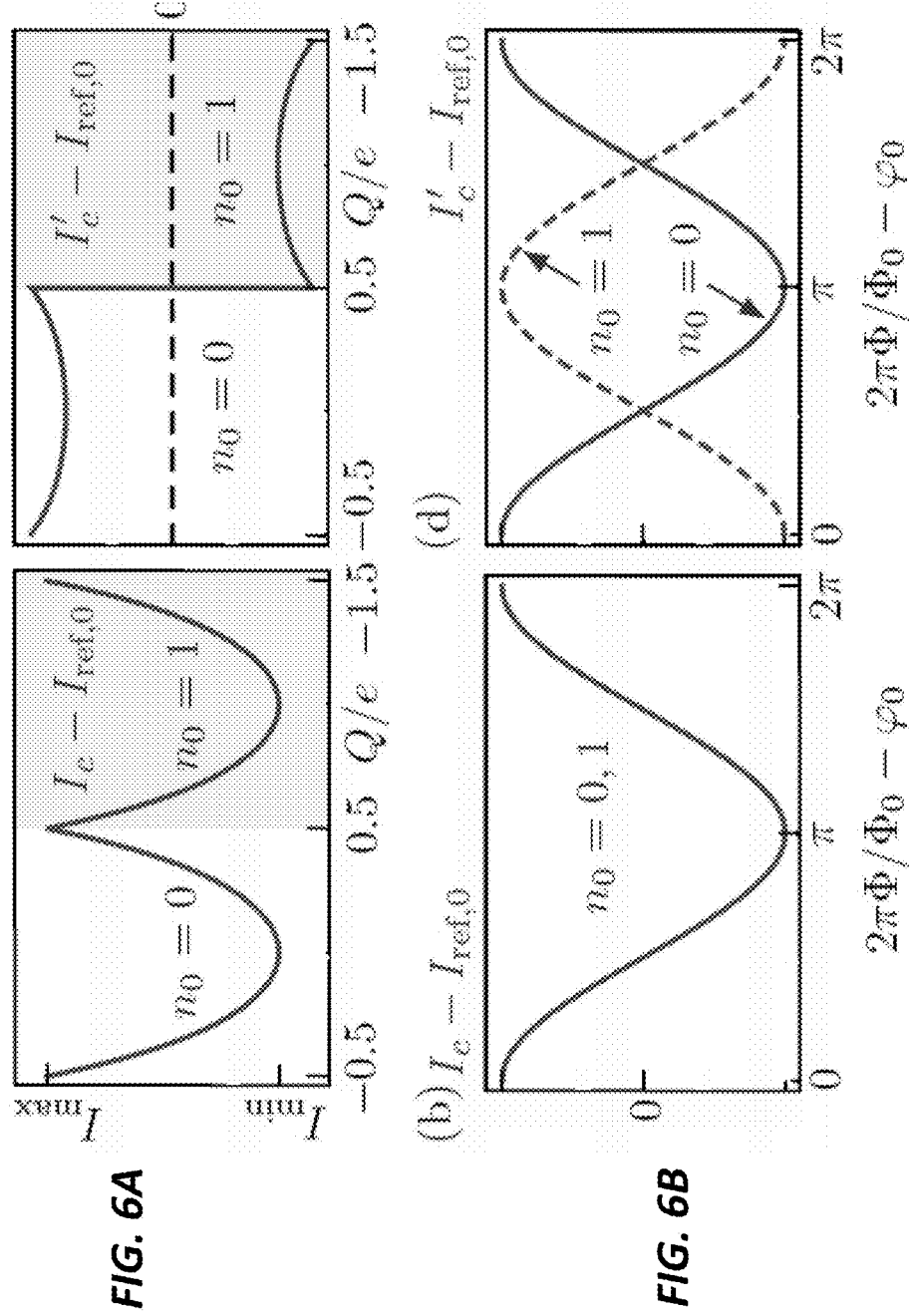
FIG. 6A  FIG. 6B  FIG. 6C  FIG. 6D

QUANTUM INFORMATION PROCESSING WITH MAJORANA BOUND STATES IN SUPERCONDUCTING CIRCUITS

CROSS-REFERENCE TO RELATED PATENT APPLICATIONS

This application claims priority, under 35 U.S.C. 119(e), to U.S. Application No. 62/615,648, filed Jan. 10, 2018, and entitled "Joint Qubit Manipulation and Readout for Majorana-Based Quantum Information Processing," and to U.S. Application No. 62/633,160, filed on Feb. 21, 2018, and entitled "Majorana Superconducting Qubit." Each of these applications is incorporated herein by reference in its entirety.

GOVERNMENT SUPPORT

This invention was made with Government support under Grant No. DE-SC0010526 awarded by the Department of Energy (DOE). The Government has certain rights in the invention.

BACKGROUND

Superconducting circuits are among the leading platforms for quantum computing. The main building block of a superconducting circuit is the superconducting qubit, which is based on the Josephson tunnel junction, a non-dissipative and non-linear electrical element that enables long-coherence times and high-fidelity gate operations. With recent advances in scaling to qubit arrays and surface code architectures, significant efforts are being made to reduce errors due to unintentional cross-talk between qubits and to avoid leakage into non-computational states.

The past years have shown rapid progress towards the realization of a topological superconductor (TSC), which is a quasi one-dimensional superconductor that hosts Majorana bound states (MBSs) at its ends and which may be useful in building a robust quantum computer. (An MBS is a zero-energy quasi-particle in a superconductor. An MBS is its own anti-particle.) Potential platforms for TSCs include hybrid superconductor (SC)-semiconductor nanowire devices under magnetic fields, chains of magnetic atoms on top of a SC substrate, and vortices in SC-topological insulator heterostructures. These platforms are designed to search for unpaired MBSs.

Topological superconductivity may also exist in time-reversal-invariant (TRI) systems (systems that are not exposed to magnetic fields) and could give rise to Kramers doublets of MBSs, also called Majorana Kramers pairs (MKPs). (An MKP consists of exactly two MBSs that transform into each other through the time-reversal symmetry operation.) In particular, a one-dimensional TRI TSC wire could host spatially separated MKPs at its two ends. Despite consisting of two MBSs, an isolated MKP is a robust zero-energy degree of freedom protected by time reversal symmetry and is therefore time-reversal-invarient.

SUMMARY

An example of the present technology is a Majorana superconducting device comprising a time-reversal-invariant (TRI) topological superconductor (TSC) island coupled between first and second superconducting leads with first and second tunable tunneling barriers and a detector operably coupled to the first and second superconducting leads. The TRI TSC has a first end to host a first Majorana-Kramers pair coupled to the first superconducting lead and a second end to host a second Majorana-Kramers pair coupled to the second superconducting lead. The first tunable tunneling barrier couples the first superconducting lead to the first end of the TRI TSC island. The second tunable tunneling barrier couples the second superconducting lead to the second end of the TRI TSC island. In operation, the second tunable tunneling barrier transmits a supercurrent from the first superconducting lead to the second superconducting lead via the first tunable tunneling barrier and the TRI TSC island. The detector measures a sign of this supercurrent, which has a sign that indicates a joint parity of the first and second Majorana-Kramers pairs.

The TRI TSC island can have a superconducting energy gap that is (i) larger than a superconducting energy gap of the first superconducting lead and (ii) larger than a superconducting energy gap of the second superconducting lead. In these cases, the TRI TSC island can have a charging energy that is smaller than the superconducting energy gap of the TRI TSC island. The TRI TSC island can also have a length that is (i) greater than a localization length of the first Majorana-Kramers pair and (ii) greater than a localization length of the second Majorana-Kramers pair.

The first and second superconducting leads can form a Josephson $\pi$-junction for an odd joint parity of the first and second Majorana-Kramers pairs. And the first and second superconducting leads can form a Josephson 0-junction for an even joint parity of the first and second Majorana-Kramers pairs.

A Majorana superconducting device comprising a TRI TSC island between first and second superconducting leads can be operated as follows. A first end of the TRI TSC island hosts a first Majorana-Kramers pair, and a second end of the TRI TSC island hosts a second Majorana-Kramers pair. The TRI TSC island conducts a supercurrent from the first superconducting lead to the second superconducting lead. And a superconducting quantum interference device or other sensor measures a sign of the supercurrent. The sign of the supercurrent indicates a joint parity of the first Majorana-Kramers pair and the second Majorana-Kramers pair.

Hosting the first Majorana-Kramers pair can include suppressing single charge transfer between the TRI TSC island and the first superconducting lead and suppressing single charge transfer between the TRI TSC island and the second superconducting lead.

Connecting the supercurrent may include actuating a first tunable tunneling barrier coupling the first end of the TRI TSC island to the first superconducting lead and actuating a second tunable tunneling barrier coupling the second end of the TRI TSC island to the second superconducting lead.

Another inventive Majorana superconducting device comprises a TSC island disposed between first and second superconducting leads, a TSC reference island disposed between the first and second superconducting leads, and a measurement device operably coupled to the first and second superconducting leads. The TSC island has a first terminal that hosts a first Majorana bound state coupled to the first superconducting lead and a second terminal that hosts a second Majorana bound state coupled to the second superconducting lead. Similarly, the TSC reference island has a first reference terminal that hosts a first reference Majorana bound state coupled to the first superconducting lead and a second reference terminal that hosts a second reference Majorana bound state coupled to the second superconducting lead. In operation, the measurement device measures a sign of a supercurrent traveling through the TSC island and the TSC reference island. The sign of this supercurrent indicates a joint parity of the first Majorana bound state, the second Majorana bound state, the first reference Majorana bound state, and the second reference Majorana bound state.

The TSC island and the TSC reference island may be separated by a distance that is (i) less than or equal to a superconducting coherence length of the first superconducting lead and (ii) less than or equal to a superconducting coherence length of the second superconducting lead.

The TSC island can have a third terminal to host a third Majorana bound state and a fourth terminal to host a fourth Majorana bound state.

The TSC island can have a length that is greater than (i) a localization length of the first Majorana bound state, (ii) a localization length of the second Majorana bound state, (iii) a localization length of the first reference Majorana bound state, and (iv) a localization length of the second reference Majorana bound state. Likewise, the TSC reference island may have a length that is greater than (i) a localization length of the first reference Majorana bound state and (ii) a localization length of the second reference Majorana bound state.

The TSC island can be one of several TSC islands disposed between the first and second superconducting leads.

The Majorana superconducting device may also include a first tunable tunneling barrier coupling the first superconducting lead to the first end of the TSC island and a second tunable tunneling barrier coupling the second superconducting lead to the second end of the TSC island. In these cases, supercurrent propagates from the first superconducting lead to the second superconducting lead via the first tunable tunneling barrier and the TSC island.

A Majorana superconducting device comprising a TSC island and a TSC reference island disposed in parallel between first and second superconducting leads can operate as follows. The TSC island and the TSC reference island conduct a supercurrent from the first superconducting lead to the second superconducting lead. And a sensor measures a sign of the supercurrent. The sign of the supercurrent indicates a joint parity of a first Majorana bound state at a first terminal of the TSC island, a second Majorana bound state at a second terminal of the TSC island, a first reference Majorana bound state at a first reference terminal of the TSC island, and a second reference Majorana bound state at a second reference terminal of the TSC island.

Conducting the supercurrent may include actuating a first tunable tunneling barrier coupling the first end of the TSC island to the first superconducting lead and actuating a second tunable tunneling barrier coupling the second end of the TSC island to the second superconducting lead.

Operating the Majorana device may further include splitting a Cooper pair from the first superconducting lead into a first electron and a second electron, coupling the first electron to the first terminal of the TSC island, and coupling the second electron to the first reference terminal of the TSC reference island. In these cases, the first electron can be coupled from the TSC island to the second superconducting lead, the second electron can be coupled from the TSC reference island the second superconducting lead, and the Cooper pair can be re-formed from the first electron and the second electron at the second superconducting lead.

BRIEF DESCRIPTIONS OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

FIG. 3A shows a four-terminal TSC island realizing a single Majorana superconducting qubit (MSQ) and a two-terminal reference island in an s-wave SC Josephson junction.

FIG. 3B illustrates a Cooper pair splitting process between a four-terminal TSC islands and a two-terminal reference island for implementing a rotation around the z axis of the MSQ Bloch sphere.

FIG. 3C illustrates a Cooper pair splitting process between a four-terminal TSC islands and a two-terminal reference island for implementing a rotation around the x axis of the MSQ Bloch sphere.

FIG. 4A illustrates a Cooper pair splitting process between two four-terminal TSC islands implementing a two-qubit entangling $XX_\chi \equiv \exp(-i\chi \hat{x}_a \hat{x}_b)$ gate for some parameter $\chi$.

FIG. 4B illustrates a SC Josephson junction hosting a linear array of MSQ unit cells, each of which includes two four-terminal TSC islands and a two-terminal reference island.

FIG. 6A is a plot of critical supercurrent $I_c$ passing through an MST versus the island-gate charge $Q$.

FIG. 6B is a plot of critical supercurrent $I'_c$ versus the magnetic flux $\Phi$ through the SQUID loop of an MST.

FIG. 6C is a plot of critical supercurrent $I_c$ passing through an AST versus the island-gate charge $Q$.

FIG. 6D is a plot of critical supercurrent $I'_c$ versus the magnetic flux $\Phi$ through the SQUID loop of an AST.

DETAILED DESCRIPTION

The inventive technology uses spatially separated Majorana bound states (MBSs) at different terminals of topological superconductor (TSC) islands between superconducting (SC) leads to perform fundamental quantum computing operations. For instance, a time-reversal-invariant (TRI) TSC island hosting spatially separated Majorana Kramers pairs (MKPs), which are doublets of MBSs, can be used for qubit read-out. When the TSC island is in the Coulomb blockade regime, with weak tunnel couplings to two s-wave SC leads, a Josephson current flows between the two SC leads due to a non-local transfer of Cooper pairs mediated by the MKPs. The sign of the Josephson current is controlled by the joint parity of all four MBSs on the TSC island. Consequently, this parity-controlled Josephson effect can be used for qubit read-out in Majorana-based quantum computing.

If the TSC island has more than two terminals coupled to the s-wave SC leads, the SC leads can be used to address a topological qubit, also called a Majorana superconducting qubit (MSQ), stored in spatially separated MBSs on the TSC island. Both the manipulation and read-out of this MSQ are realized by tunnel couplings between MBSs and the SC leads. The ability to turn the tunnel couplings on and off on-demand with local gates enables individual qubit addressability while avoiding cross-talk errors. By combining the scalability of superconducting qubit and the robustness of topological qubits, the MSQ may provide a promising and realistic route towards quantum computation.

A prerequisite of the Majorana superconducting qubit is that the superconducting islands indeed hosts Majorana bound states at the terminal point. But accidental fine tuning of system parameters can cause zero energy (or close to zero energy) Andreev bound states to occur at the terminal points. Unfortunately, Andreev bound states are not useful for quantum computing.

Fortunately, Andreev bound states can be distinguished from Majorana bound states using a Cooper pair transistor (CPT), which can be realized by a mesoscopic superconductor island that couples to a pair of s-wave superconducting leads. For a trivial island, the critical supercurrent between the leads exhibits a 2e-periodicity in the island-gate charge. But for an island with spatially separated zero-energy Majorana bound states (MBSs) or Andreev bound states (ABSs), the periodicity of the magnitude of the critical supercurrent transitions to 1e in the island-gate charge. Moreover, for ABSs the current-phase relation displays a sign reversal when the parity of the charge ground state of the island changes between even and odd. Notably, for Majorana bound states the same sign reversal does not occur.

1 Parity-Controlled 2π Josephson Effect Mediated by Majorana Kramers Pairs

Figure 1A:
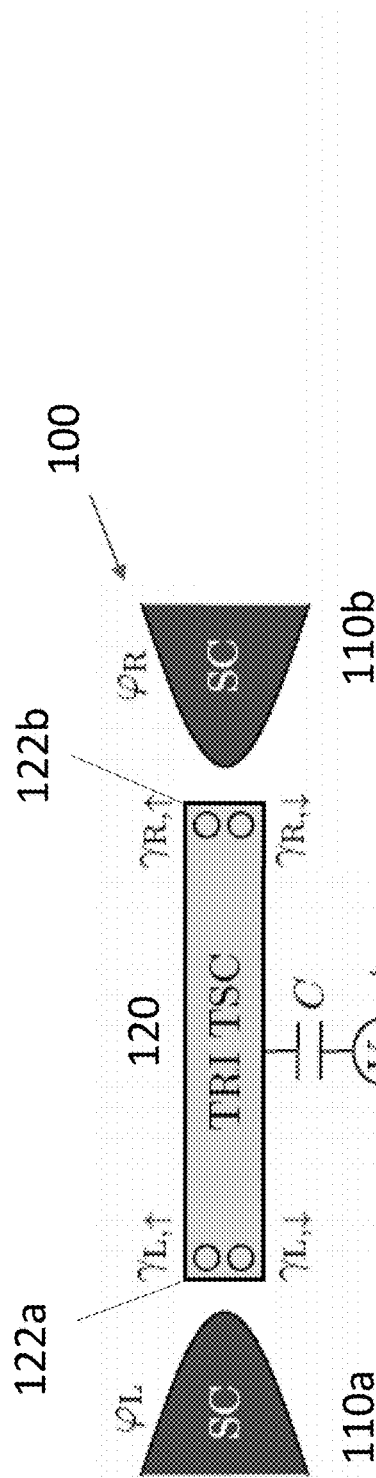
FIG. 1A shows two s-wave superconducting (SC) leads with superconducting phases $(1)_{l,r}$ coupled to opposite ends of a mesoscopic time-reversal-invariant (TRI) topological superconducting (TSC) island.

FIG. 1A illustrates a device 100, also called a Majorana Kramers junction, that exhibits the Josephson effect in a mesoscopic time-reversal-invariant (TRI) topological superconductor (TSC) island 120. It can measure total fermion parity, which is useful for measuring the state of a Majorana superconducting qubit as described below. The fermion parity affects the sign of the supercurrent that flows through the TRI TSC island 120.

The TRI TSC island 120 can be implemented as two semiconducting wires that are coupled by a common superconductor at zero magnetic field. The TRI TSC island 120 is coupled between two s-wave superconducting (SC) leads 110a and 110b (collectively, SC leads 110) via two spatially separated Majorana Kramers pairs (MKPs) $\gamma_{\ell=L,R}$. One MKP is at one end 122a of the island 120 and the other MSP is at the other end 122 of the island 120, with s=↑,↓ at the boundaries between the island 120 and the SC leads 110. The island 120 is grounded by a capacitor with capacitance C and attains a finite charging energy which is tunable via an external gate voltage $V_g$.

The TSC island 120 can be formed by depositing mescopic SC material on a nanowire and etching the deposited mesoscopic SC material. This creates semiconducting tunneling barriers connecting the island 120 to the SC leads 110 with transparencies that are tunable by local side gates. The TSC island 120 can also be defined in a heterostructure of a two-dimensional electron gas and a SC material by top-down lithography and gating. One advantage of a heterostructure implementation is that the device can be scale from a single island 120 to multiple islands and/or to islands with more terminals and more complicated shapes, e.g., as in the Majorana superconducting qubit devices shown in FIGS. 3A-3C, 4A, 4B, and 5A-5D and discussed below.

The SC leads 110 could be made of aluminium or another s-wave superconductor. They can be made of any size. The SC leads 110 can be coupled to the superconducting island 120 via semiconducting tunneling barriers. These barriers should be shorter than the superconducting coherence length of the superconducting leads 110.

Figure 1B:
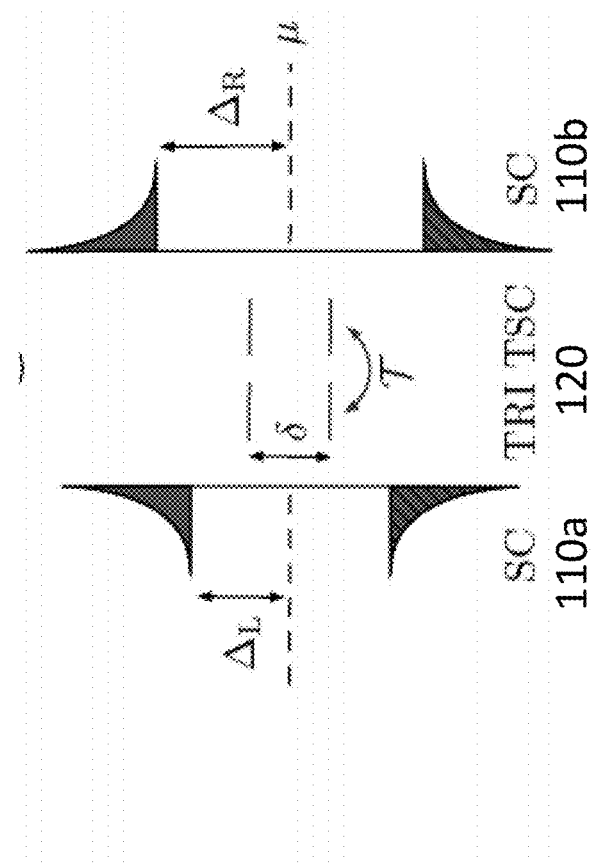
FIG. 1B shows a schematic energy spectrum of the TRI TSC island and superconducting leads of FIG. 1A.

FIG. 1B shows a schematic energy spectrum of the island 120 and the two SC leads 110 with superconducting gaps $\Delta_{\ell=L,R}$ close to a resonance. The low-energy charge states of the island 120 are related by time-reversal symmetry $\mathcal{T}$ and are split by an amount δ with $|\delta|\ll\Delta_\ell$ due to a finite detuning away from resonance. The island superconducting gap is assumed to be the largest energy scale.

When the island 120 is in the Coulomb blockade regime, a finite Josephson current flows due to higher order co-tunneling processes in which Cooper pairs in the SC leads 110 tunnel in and out of the spatially separated MKPs localized at opposite ends 122a and 122b of the island 120. The sign of the resulting Josephson current is controlled by the joint parity of the two MKPs. For the case of odd joint parity, the two SC leads 110 form a Josephson π-junction, whereas for even joint parity the two SC leads form a Josephson 0-junction. Besides being a robust and easily accessible property of MKPs, the sign reversal of the Josephson current may prove useful for qubit read-out in Majorana-based quantum computing. The sign of the Josephson current can be measured using a superconducting quantum interference device (SQUID), e.g., where the superconducting leads 110 form a flux-threaded loop and are connected by an additional reference junction.

Without being bound by any particular theory, the SC leads 110 ($\ell$=L,R) can be described by the Bardeen-Cooper-Schrieffer (BCS) Hamiltonian, $$H_0 = \sum_{\ell=L,R} \sum_k \Psi^\dagger_{\ell,k}(\xi_k \eta_z + \Delta_\ell \eta_x e^{i\varphi_\ell \eta_z})\Psi_{\ell,k}. \quad (1)$$

Here, $\Psi_{\ell,k}=(c_{\ell,k\uparrow}, c_{\ell,-k\downarrow}^\dagger)^T$ $\Psi_{\ell,k}$ is a Nambu spinor with $c_{\ell,ks}$ the electron annihilation operator, where k denotes single-particle states with normal state dispersion $\xi_k$ and Kramers index s=↑,↓. s-wave pairing occurs between Kramers pairs (k,s) and (-k,-s), resulting in the superconducting gap $\Delta_\ell$. The SC phase difference $\varphi_L-\varphi_R$ is controlled by a flux-threaded SC loop far away from the junction so that the effect of the magnetic field in the junction region is zero. The Pauli matrices acting in Nambu space are $\eta_{x,y,z}$. The magnitudes of the superconducting gaps are taken to be identical, $\Delta \equiv \Delta_L = \Delta_R$.

The TRI TSC island 120 hosts a MKP $\gamma_{\ell,s}$ at each boundary. The two members of a MKP are related by time-reversal symmetry, $$\mathcal{T}\gamma_{\ell,\uparrow}\mathcal{T}^{-1} = \gamma_{\ell,\downarrow}, \quad \mathcal{T}\gamma_{\ell,\downarrow}\mathcal{T}^{-1} = -\gamma_{\ell,\uparrow} \quad (2)$$

The island 120 is much longer than the MBS localization lengths, so that the wavefunction overlap of MKP on opposite boundaries is negligible. Typically, the MBS localization is about 100 nm, which implies that the island 120 should be on the order of 1000 nm long. Since MBSs are zero-energy degrees of freedom hosting unpaired electrons without energy cost, the TRI TSC island 120 can accommodate even and odd numbers of electrons on equal ground. For a TRI TSC island 120 of mesoscopic size, there is also a finite charging energy given by $$U_C(n) = (ne - Q_0)^2 / 2C \quad (3)$$

Here, $Q_0$ is a gate charge that is continuously tunable via a gate voltage $V_g$ across a capacitor with capacitance C.

Finally, consider the tunnel coupling between the TRI TSC island 120 and the s-wave SC leads 110. If the product of the temperature and Boltzmann's constant is sufficiently small compared to the charging energy $U \equiv e^2/2C$ and the superconducting gaps of both the SC leads 110 and the island 120, there shouldn't be any occupied quasiparticle states, so the Josephson current is predominantly carried by the ground state of the junction. The SC gap in the island 120 is sufficiently large so that virtual transitions via quasiparticle states in the island 120 are negligible.

Single-particle tunneling between MKPs in the island 120 and the SC leads 110 is described by the Hamiltonian $$H_T = \sum_{\ell=L,R}\sum_{k,s's} \lambda_{\ell s s'} c^\dagger_{\ell,k s'} \gamma_{\ell,s} e^{-i\varphi/2} + H.c. \quad (4)$$

Here, the tunneling amplitudes at the junction between the island and the lead $\lambda^*_{\ell s s'}$ are allowed to take the most general form, i.e., complex and spin-dependent. Time reversal symmetry implies $\lambda^*_{\ell s s'} = (s_y)_{st}\lambda_{\ell tt'}(s_y)_{t's'}$, with $s_{x,y,z}$ denoting the Pauli matrices in spin-space. One can choose a proper spin basis transformation so that the tunneling amplitude becomes real and spin-independent, i.e., $\lambda^*_{\ell s s'} = \lambda_\ell \delta_{ss'}$. Without loss of generality, this choice will be adopted below.

The operator $e^{\pm i\varphi/2}$ in Eq. (4) increases/decreases the total charge of the TRI TSC island 120 by one charge unit, $[n, e^{\pm i\varphi/2}] = \pm e^{\pm i\varphi/2}$ while the MBS operators $\gamma_{\ell,s}$ change the electron number parity in the TRI TSC island 120. The MBSs at one end 122a (122b) of the island 120 do not couple to the SC lead 110b (110a) at the opposite end 122b (122a) of the island 120 because the MBS localization length is much shorter than the island length. To summarize, the full Hamiltonian is $H = H_0 + U_C(n) + H_T$.

1.1 Josephson Current Near a Resonance

A Josephson current occurs due to Cooper pair tunneling between the TRI TSC island 120 and the two SC leads 110 enabled by the two MKPs. To see why, consider the near-resonant case, $|\delta| \ll \Delta$ with $\delta \equiv U_C(n_0) - U_C(n_0+1)$. This allows the Hilbert space of the island 120 to be truncated, retaining the states with $n_0$ and $n_0+1$ units of charge as shown in FIG. 1B. The remaining charge states are separated from this low-energy subspace by a large charging energy, $U \gg \Delta \gg \pi v_\ell |\lambda_\ell|^2$, and hence have negligible contribution to the Josephson current.

The superconducting gap $\Delta$ in the SC leads 110 shown in FIG. 1B suppresses single charge transfer across the TRI TSC island 120 at low energy. Cooper pair transport occurring separately between each SC lead and the island is also inhibited or forbidden, as it would alter the charge of the island 120 by 2e and thereby leak out of the low-energy Hilbert space. Hence, up to fourth order in the tunneling amplitudes $\lambda_\ell$, there are two types of co-tunneling processes give rise to coherent Josephson coupling between the two SC leads. Each process transfers a charge of 2e between the two SC leads 110 through the TRI TSC island 120.

Figure 2A:
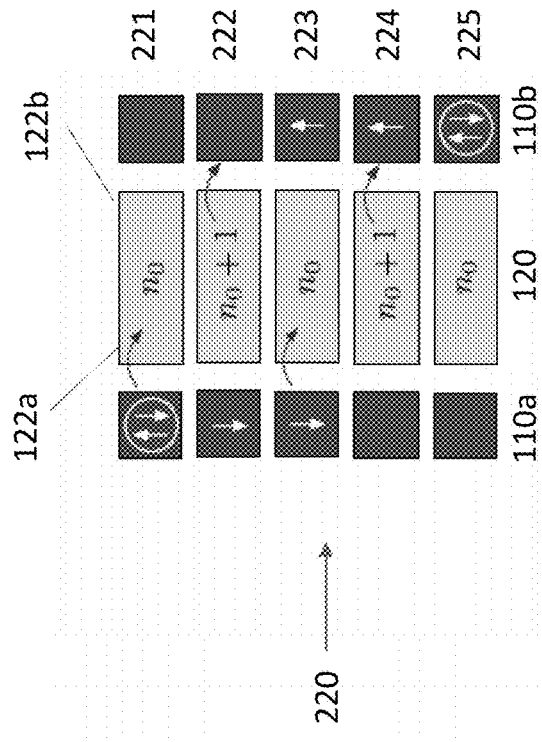
FIG. 2A illustrates a process for transporting a Cooper pair transport between SC leads via a TRI TSC island that initially carries $n_0+1$ units of charge.

FIG. 2A shows a process 210 for Cooper pair transport from one SC lead 110a to the other SC lead 110b via the TRI TSC island 120 when the island 120 initially carries $n_0+1$ units of charge. The Cooper pair (represented by oppositely directed arrows in a circle) starts at the first SC lead 110a. One electron (each electron is represented by an arrow) is transferred from the island 120 to the destination SC lead 110b in step 211, reducing the charge carried by the island 120 from $n_0+1$ units to $n_0$ units. In step 212, one electron of the Cooper pair is transferred from the source SC lead 110a to the island 120, raising the charge carried by the island 120 back to $n_0+1$ units. This extra electron is transferred from the island 120 to the destination SC lead 110b in step 213, where it is reunited with the electron transferred to the destination SC lead 110b in step 211 to re-form the Cooper pair at the destination SC lead 110b. In step 214, the remaining electron at the source SC lead 110a is transferred to the island 120. At the end of the process 210 (step 215), the source SC lead 110a carries no charge, the island 120 carries $n_0+1$ units of charge, and the destination SC lead 110b hosts a Cooper pair.

Figure 2B:
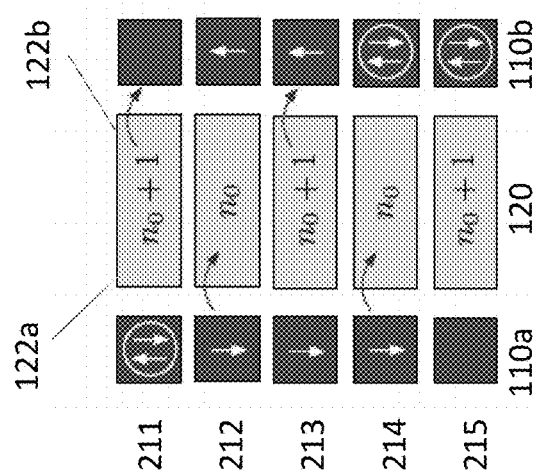
FIG. 2B illustrates a process for transporting a Cooper pair transport between SC leads via a TRI TSC island that initially carries $n_0$ units of charge.

FIG. 2B shows a process 220 for Cooper pair transport from one SC lead 110a to the other SC lead 110b via the TRI TSC island 120 when the island 120 initially carries $n_0$ units of charge. The process 220 in FIG. 2B is like the process 210 in FIG. 2A with the intermediate steps of adding and removing charges are reversed. Again, the Cooper pair starts at the first SC lead 110a. In step 221, one electron of the Cooper pair is transferred from the source SC lead 110a to the island 120, raising the charge carried by the island 120 from $n_0$ units to $n_0+1$ units. In step 222, one electron is transferred from the island 120 to the destination SC lead 110b, reducing the charge carried by the island 120 from $n_0+1$ units to $n_0$ units. The remaining electron from the source SC lead 110a is transferred to the island 120 in step 223, then moved to the destination SC lead 110b in step 224, where it is reunited with the electron transferred to the destination SC lead 110b in step 222 to re-form the Cooper pair at the destination SC lead 110b. By step 225, the transfer is complete; the source SC lead 110a carries no charge, the island 120 carries $n_0$ units of charge, and the destination SC lead 110b hosts a Cooper pair.

The amplitude of the processes 210 and 220 in FIGS. 2A and 2B, respectively, at and near resonance are derived in the limit of weak tunnel coupling, $\Gamma_\ell \equiv \pi v_\ell |\lambda_\ell|^2 \ll \Delta$ with $v_\ell$ the normal-state density of states per spin of the $\ell$-SC at the Fermi energy. The resulting effective Hamiltonian acting on the reduced Hilbert space consisting of the BCS ground states of the SC leads 110 and the charge states $n_0$ and $n_0+1$ of the mesoscopic TRI TSC island 120 reads, $$H_{eff} = \frac{\delta}{2}\tau_z - (\gamma_{R,\uparrow}\gamma_{L,\uparrow}\gamma_{R,\downarrow}\gamma_{L,\downarrow})\left(J_0 + \frac{J_1\delta}{\Delta}\tau_z\right)\cos(\varphi_L - \varphi_R) \quad (5)$$

where $\tau_z=\pm 1$ denotes the charge states $n_0$ and $n_0+1$ in the island 120, respectively. Here, the first term describes the energy splitting $\delta$ of the two charge states due to detuning the gate charge $Q_0$ away from the resonant point $Q_0/e=n_0+\frac{1}{2}$. Moreover, $J_0$ is the Josephson coupling at resonance, while $J_1$ is the lowest-order correction for a small detuning $\delta/\Delta$ away from resonance. The Josephson coupling and the lowest-order correction can be expressed as:

$$J_0 = \frac{16\Gamma_L\Gamma_R}{\pi^2\Delta}\int_1^\infty \frac{dxdy}{[f(x)+f(y)][f(x)f(y)]^2} \quad (6)$$

$$J_1 = \frac{16\Gamma_L\Gamma_R}{\pi^2\Delta}\left(\frac{3}{2} - \sqrt{2}\right),$$

where $f(x) \equiv \sqrt{1+x^2}$.

The effective Hamiltonian given in Eq. (6) relates the Josephson current to the joint fermion parity of the four MBSs on the island 120, $\gamma_{R,\uparrow}\gamma_{L,\uparrow}\gamma_{R,\downarrow}\gamma_{L,\downarrow}$. Depending on the fermion parity being even or odd, $\gamma_{R,\uparrow}\gamma_{L,\uparrow}\gamma_{R,\downarrow}\gamma_{L,\downarrow}=\pm 1$, the Josephson current between the SC leads is given by $$I = \pm\frac{2e}{\hbar}\left(J_0 + \frac{J_1\delta}{\Delta}\tau_z\right)\sin(\varphi_L-\varphi_R). \quad (7)$$

Eq. (6) also applies to the general case of a TRI TSC island 120 hosting any number of spatially separated MKPs. When two of these MKPs couple to separate SC leads 110, they mediate a Josephson current given by Eq. (7) where ± denotes their joint fermion parity being even or odd, respectively.

For a TSC island with only two MKPs, in the absence of quasiparticle poisoning, the joint parity is given by the total island charge mod 2, $\gamma_{L,\uparrow}\gamma_{R,\uparrow}\gamma_{L,\downarrow}\gamma_{R,\downarrow}=(-1)^n$. After truncating the Hilbert space of the island to two charge states $n=n_0$, $n_0+1$, the joint parity becomes $$\gamma_{L,\uparrow}\gamma_{R,\uparrow}\gamma_{L,\downarrow}\gamma_{R,\downarrow}=(-1)^{n_0}\tau_z. \quad (8)$$

The Josephson current given in Eq. (7) then simplifies to $$I = \frac{2e}{\hbar}\left(J_0\sigma_z + \frac{J_1\delta}{\Delta}\right)\sin(\varphi_L - \varphi_R), \quad (9)$$

where $$\sigma_z \equiv (-1)^{n_0}\tau_z = \pm 1$$

denotes the even- (odd-) parity member of the two nearly-degenerate charge states $n_0$ and $n_0+1$ in the TRI TSC island, and $\tilde\delta \equiv (-1)^{n_0}\delta$ is the energy difference of the $\sigma_z=+1$ and $\sigma_z=-1$ state. Four aspects are noteworthy:

First, the Josephson current between the SC leads 110 is mediated solely by the MKPs localized at opposite boundaries of the TRI TSC island 120 with its magnitude determined by the coupling strengths at the two junctions. This is remarkable because the MKPs have essentially zero wave-function overlap and so no direct coupling exists between the MKPs. As a result, the Josephson effect may require longer measurement times as it emerges only at fourth order in the tunneling amplitudes.

Second, for a given phase difference $\phi_L-\phi_R$, the sign of the Josephson current in Eq. (7) depends on the joint fermion parity of the four MBSs. For a given fermion parity state, the Josephson current is a periodic with respect to the phase, hence the name "parity-controlled $2\pi$ Josephson effect" for Eq. (7). When the joint parity of the four MBSs is even, $\gamma_{L,\uparrow}\gamma_{R,\uparrow}\gamma_{L,\downarrow}\gamma_{R,\downarrow}=+1$, the critical current is positive, $I_c>0$, and the superconducting weak link forms a Josephson 0-junction. (Here, the critical current is taken to be the amplitude of the Josephson current.) When the joint parity of the four MBSs is odd, $\gamma_{L,\uparrow}\gamma_{R,\uparrow}\gamma_{L,\downarrow}\gamma_{R,\downarrow}=-1$, the sign of the critical current is negative, $I_c<0$, and the weak link forms a Josephson $\pi$-junction.

Figure 2C:
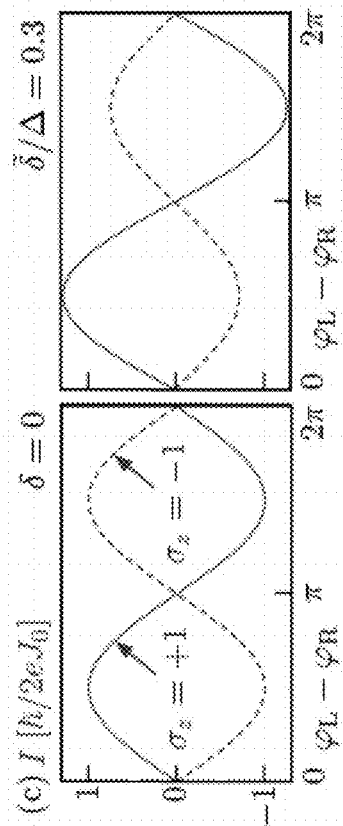
FIG. 2C is a plot of Josephson current I (in units of $\hbar/2 eJ_0$) through the TRI TSC island in FIG. 1A versus the SC phase difference $\phi_L - \phi_R$ for $\delta=0$ (left panel) and $\delta/\Delta=0.3$ (right panel).

FIG. 2C shows plots of Josephson current I (in units of $\emptyset/2eJ_0$) versus the SC phase difference $\varphi_L-\varphi_R$ for $\delta=0$ (left panel) and $\tilde\delta/\Delta=0.3$ (right panel). If the joint parity of the MBSs is even, $\sigma_z=+1$, the weak link forms a Josephson 0-junction. Otherwise, it forms a Josephson $\pi$-junction. At resonance, when $\delta=0$, the magnitude of the critical current is identical for both the even and odd parity branches (left panel). This symmetry is lifted away from resonance when $\delta\neq 0$ (right panel).

The parity-controlled Josephson effect has at least two immediate applications: (1) the switching times between positive and negative critical currents through the island provide a way of measuring the quasiparticle poisoning rate; and (2) for sufficiently long parity lifetimes, the sign of the critical current permits a direct measurement of the joint parity of four MBSs in the island, which is useful for Majorana-based quantum computing. In contrast, for time-reversal-breaking TSCs with unpaired MBSs, the sign of the Josephson current in the $4\pi$-periodic Josephson effect only permits measuring the parity of two MBSs in the weak limit.

Third, Eq. (9) shows that on resonance ($\delta=0$), $J_1=0$, i.e., the magnitude of critical current in even and odd parity branches is identical. Away from resonance ($\delta\neq 0$), $J_1\neq 0$. Hence this symmetry is lifted and the critical current mediated by the TSC island 120 in even or odd configurations differs in magnitude. When the even parity state is higher (lower) in energy $\tilde\delta>0$ (<0), the corresponding critical current is larger (smaller) in magnitude, see Eq. (9) and FIG. 2C.

Fourth, the Josephson coupling for the limit of large charging energy $(U\gg \pi v_\ell|\lambda_\ell|^2)$ is qualitatively different from the zero charging energy case. In the zero charging energy case, the dominant contributions are of second-order in the tunnel amplitudes leading to a Josephson coupling $\propto \sin\phi_\ell$.

In the intermediate charging energy regime $(U\sim \pi v_\ell|\lambda_\ell|^2)$, both sinusoidal and cosinusoidal contributions are present, yielding an interaction-dependent anomalous phase shift in the current-phase relation that interpolates between the zero and large charging energy limit.

1.2 Josephson Current Near a Coulomb Valley

The parity-controlled Josephson effect is more general and also arises near a Coulomb valley when $Q_0/e$ is close to an integer value, 2N+1 or 2N, so that the ground states of the island consist of either an odd number of electrons, $n_0=2N+1$, or an even number of electrons, $n_0=2N$.

Under this condition, Cooper pair transport occurs via virtually excited states of order U on the island 120. Up to fourth order in the couplings $\lambda_\ell$, three types of co-tunneling processes contribute to the Josephson coupling: The first type of process involves subsequently adding and removing a unit of charge on the island 120. For the second type of process, the first two intermediate steps involve adding/removing a charge on the island 120, while in the final two intermediate steps this order of adding/removing a charge is reversed. In the third type of process, a Cooper pair from one lead 110a is added to and removed from on the island 120 in the first two intermediate steps, which alters the island charge by 2e. Subsequently, the Cooper pair is again removed from and added to the other lead 110b in the final two intermediate steps so that the island 120 returns to its ground state. The processes of the second and third type involve intermediate charge states $n_0-1$, $n_0 \pm 2$, which are energetically unfavourable in the close-to-resonance case, but should be included in the Coulomb valley case.

The amplitudes of the processes can be calculated in the limit of weak tunnel couplings, $\Gamma_\ell \ll \Delta$, U, using fourth-order perturbation theory. The resulting effective Hamiltonian acting on the BCS ground states of the SC leads and the charge ground states on the island reads, $$H'_{\text{eff}} = -(\gamma_{R,\uparrow}\gamma_{L,\uparrow}\gamma_{R,\downarrow}\gamma_{L,\downarrow})J' \cos(\varphi_L - \varphi_R). \quad (10)$$

In Eq. (10), the term $J' = J'_0 + J'_1 + J'_2$ is a coupling constant whose components are:

$$J'_0 = \frac{32\Gamma_L\Gamma_R}{\pi^2 \Delta} \int_1^\infty \frac{dxdy}{f(x)f(y)[f(x)+f(y)]g(x)g(y)} \quad (11)$$

$$J'_1 = \frac{32\Gamma_L\Gamma_R}{\pi^2 \Delta} \int_1^\infty \frac{dxdy}{f(x)f(y)[f(x)+f(y)]g(x)^2}$$

$$J'_2 = \frac{8\Gamma_L\Gamma_R}{\pi^2 U}\left[\int_1^\infty \frac{dx}{f(x)g(x)}\right]^2, \text{ and}$$

$$g(x) \equiv \sqrt{1+x^2} + U/\Delta.$$

The direct coupling of the effective Hamiltonian to the joint parity $\gamma_{R,\uparrow}\gamma_{L,\uparrow}\gamma_{R,\downarrow}\gamma_{L,\downarrow}$ is preserved near a Coulomb valley. For the case when the joint parity is fixed by the total island charge mod 2, $$\gamma_{L,\uparrow}\gamma_{R,\uparrow}\gamma_{L,\downarrow}\gamma_{R,\downarrow} = (-1)^{n_0}. \quad (12)$$

the resulting Josephson current is given by, $$I' = (-1)^{n_0}(2e/\hbar)J'\sin(\varphi_L - \varphi_R). \quad (13)$$

This result implies three features:

First, unlike in the close-to-resonance case, the Josephson current consists of only a single branch for either an even parity ground state, $n_0 = 2N$, or an odd parity ground state, $n_0 = 2N+1$. However, the sign of the critical current $I'_c \equiv (-1)^{n_0}(2e/\hbar)J'$ remains a direct measure of the joint parity $\gamma_{R,\uparrow}\gamma_{L,\uparrow}\gamma_{R,\downarrow}\gamma_{L,\downarrow}$ through the gauge constraint given in Eq. (12).

Second, in comparison to the close-to-resonance case, the sign of the supercurrent is expected to be more stable against quasiparticle poisoning events due to the large charging energy.

Third, at the Coulomb valleys, the magnitude of the critical current is identical for both even and odd configurations. This behavior is in contrast with weak links of two SC leads coupled via a quantum dot, where odd and even charge states of the quantum dot create Josephson 0- and π-junctions, respectively, but with critical current generally of different magnitude.

Under rather general conditions no Josephson current is observed when the TRI TSC island 120 is replaced by a time-reversal-breaking TSC island in symmetry class D. Without being bound to a particular theory, this may be because after a proper spin basis transformation, a non-degenerate MBS in the TSC island couples only to a single spin species and not to both spin species as MKPs do in the case for a TRI TSC island 120. Finally, a parity-controlled Josephson effect can also appear for a trivially superconducting wire with a low-lying Andreev bound state described by two hybridized MBSs at each end. In this case, the parity-controlled Josephson effect enables the read-out of non-topological Andreev qubits.

2 Majorana Superconducting Qubits

The parity-controlled Josephson effect can be used in a platform for universal quantum computing with the scalability of the superconducting qubit and the robustness of Majorana qubit. In this platform 300, shown in FIG. 3A, a multi-terminal TSC island 320 with spatially separated Majorana bound states (MBSs) acts as a weak link between a pair of SC electrodes 310a and 310b (collectively, SC electrodes 310). A two-terminal TSC reference island 330 acts another TSC weak link in parallel with the multi-terminal TSC island 320 between the SC electrodes 310. The TSC island's terminals 322a-322d are coupled to the SC leads 310 by respective tunable tunneling barriers 342a-342d. Likewise, the reference TSC island's terminals 334a and 334b are coupled to the SC leads 310 by respective tunable tunneling barriers 344a and 344b. These tunable tunneling barriers can be tuned or actuated by local gating that reduces the electron density between the two superconducting leads.

The TSC island 320 and reference TSC island 330 are longer than the localization length $\xi_{MBS}$ of the MBSs $\gamma_\ell$ and $\gamma_{\ell,ref}$ which emerge at the islands' terminal points 322 and 334. For instance, each island 320, 330 may be about 1000 nm long and the MBS localization length may be about 100 nm long. The distance from the uppermost TSC island terminal 322a to the left terminal 334a of the reference TSC island 330 should be at most of the order of the superconducting coherence length $\xi_{SC}$ (e.g., about 100 nm) thereby enabling Cooper pair splitting between the superconducting leads 310 mediated by the MBSs.

The TSC island 320 and reference TSC island 330 can be realized as hybrid InAs/Al nanowires. A thin layer of superconducting Al is coated on a semiconducting InAs nanowire. To define an island coupled to a superconducting lead, the Al shell is locally etched (removed) to define a semiconducting tunneling barrier. The transparency of this barrier is tunable by local side gate electrodes. Applying a voltage to the barrier via the gate electrode changes the electron density between the SC lead and TSC island. Reducing the electron density in the tunneling barrier raises the barrier, blocking Cooper pair transport through the barrier. Increasing the electron density in the tunneling barrier lowers the barrier, allowing Cooper pair transport through the barrier.

The TSC island 320 and reference TSC island 330 operate in the Coulomb blockade regime and mediate the Josephson coupling via virtual charge fluctuations. The TSC island 320 hosts four MBSs ($\gamma_1$, $\gamma_2$, $\gamma_3$, $\gamma_4$) at the four terminals 322, which stores a single topological qubit. This basic building block—a Majorana-based qubit in an all-superconducting circuit—is called a "Majorana superconducting qubit" (MSQ). The qubit read-out is achieved by measuring the persistent Josephson supercurrent I in the loop with a superconducting quantum interference device 350 or with transmission line resonators whose resonance frequencies change depending on the qubit state. Josephson supercurrent propagating counterclockwise and clockwise represent |0⟩ and |1⟩ qubits states, respectively.

The terminals 334 of the reference TSC island 330 host two MBSs ($\gamma_{1,ref}$, $\gamma_{2,ref}$) for qubit manipulation and readout. The full set of single-qubit rotations is achieved by selectively turning on and off the tunnel couplings 342 and 344 between individual MBSs and the SC electrodes 310 that enable different Cooper pair splitting processes as discussed below with reference to FIGS. 3B and 3C.

FIG. 3B shows a four-step Cooper pair splitting process 301 between the TSC island 320 and the two-terminal reference TSC island 330 utilized for implementing rotations around the z-axis of the MSQ Bloch sphere. In the first step, the tunable tunneling barrier 342a connecting the first SC lead 310a to the first terminal 322a on the TSC island 320 is actuated to allow an electron to tunnel from the first SC lead 310a to the first terminal 322a. In the second step, the tunable tunneling barrier 344a connecting the first SC lead 310a to the first terminal 334a on the reference TSC island 330 is actuated to allow an electron to tunnel from the first SC lead 310a to the first terminal 334a. In the third step, the tunable tunneling barrier 342b connecting the second terminal 322b on the TSC island 320 to the second SC lead 310b is actuated to allow an electron to tunnel from the second terminal 322b to the second SC lead 310b. And in the fourth step, the tunable tunneling barrier 344b connecting the second terminal 334b to the second SC lead 310b on the reference TSC island 330 is actuated to allow an electron to tunnel from the second terminal 334b to the second SC lead 310b.

FIG. 3C shows a Cooper pair splitting process 302 between the TSC island 320 and reference TSC island 330 for rotations around the x-axis of the MSQ Bloch sphere. In the first step, the tunable tunneling barrier 342c connecting the first SC lead 310a to the third terminal 322c on the TSC island 320 is actuated to allow an electron to tunnel from the first SC lead 310a to the third terminal 322. In the second step, the tunable tunneling barrier 344a connecting the first SC lead 310a to the first terminal 334a on the reference TSC island 330 is actuated to allow an electron to tunnel from the first SC lead 310a to the first terminal 334a. In the third step, the tunable tunneling barrier 342b connecting the second terminal 322b on the TSC island 320 to the second SC lead 310b is actuated to allow an electron to tunnel from the second terminal 322b to the second SC lead 310b. And in the fourth step, the tunable tunneling barrier 344b connecting the second terminal 334b to the second SC lead 310b on the reference TSC island 330 is actuated to allow an electron to tunnel from the second terminal 334b to the second SC lead 310b.

An MSQ should have many advantages over a conventional superconducting qubit. First, the nonlocal storage of quantum information in well-separated MBSs protects the MSQ from decoherence under local perturbations at a physical level. The MSQ is also insensitive to global electrostatic fluctuations that couple to the total charge on the TSC island. Second, since a MSQ is formed by two topologically degenerate states that are separated from the excited states by the TSC gap, leakage to non-computational states, which is a common problem in gate operations on weakly-anharmonic transmon qubits, is strongly suppressed. Third, both gate operations and qubit read-out are realized by tuning tunnel couplings 342 between the TSC island 320 and the superconducting leads 310. These tunnel couplings 342 can be turned on and off on-demand through local gates as recently demonstrated in semiconductor-based superconducting qubits. Importantly, a specific set of tunnel couplings are to be turned on only during the gate operation and measurement. The ability to pinch off unwanted tunnel couplings makes it possible to address MSQ individually without cross-talk errors. This provides an advantage over flux-controlled tuning of Josephson energy in transmon and hybrid transmon-Majorana qubits.

The use of superconducting interference effect for qubit manipulation and read-out is an advantage over other Majorana-based quantum computation platforms, where MBSs are addressed by Aharonov-Bohm interference of single electrons. Aharonov-Bohm interference of single electrons requires electron phase coherence in a non-superconducting lead. The limited phase coherence length in InAs nanowires constrains the geometry of a device that uses Aharonov-Bohm interference of single electrons.

In contrast, in the device 300 of FIG. 3A, there is no upper bound on the size of the superconducting loop, as the persistent supercurrent is dissipationless. The separation between the TSC island 320 and the reference TSC island 330 is shorter than the superconducting coherence length to enable Cooper pair splitting processes like those shown in FIGS. 3B and 3C. For conventional superconductors, such as aluminium, the coherence length can be several hundreds of nanometers. Finally, another advantage of MSQs is that the energy gap of the SC leads 310 provides additional protection against quasiparticle poisoning independent of the island charging energies. This should significantly reduce fine-tuning of the island gate charges for protection from quasiparticle poisoning.

The MBSs which form at the terminal points 322 of the TSC island 320 are denoted by $\gamma_\ell$ and by $\gamma_{\ell,ref}$ for the terminal points 334 of the two-terminal reference TSC island 330. If islands 320 and 330 are much longer than the MBS localization length $\xi_{MBS}$ such that the wavefunction hybridization of MBSs localized at opposite terminals is negligible, the MBSs should reside at zero energy. Since the TSC island 320 and reference TSC island 330 are each of mesoscopic size, each island acquires a finite charging energy $$U=(ne-Q)^2/2C \tag{14a}$$

$$U_{ref}=(n_{ref}e-Q_{ref})^2/2C_{ref} \tag{14b}$$

Here, n and $n_{ref}$ denote the number of unit charges on the TSC island 320 and reference TSC island 330, respectively. Furthermore, $Q$ and $Q_{ref}$ are gate charges which are continuously tunable via gate voltages across capacitors with capacitances C and $C_{ref}$, respectively (for simplicity, these capacitances are taken to be equal, i.e., $C=C_{ref}$). Assuming the strong Coulomb blockade regime and a tuning of the gate charges $Q$, $Q_{ref}$ close to integer values, the total fermion parities of the TSC island 320 and reference TSC island 330 obey the constraints, $$\gamma_1\gamma_1\gamma_1\gamma_1=(-1)^{n_0-1} \tag{15a}$$

$$i\gamma_{1,ref}\gamma_{2,ref1}=(-1)^{n_{0,ref}} \tag{15b}$$

These expressions don't include finite-energy quasiparticle contributions, which is a justified provided that the island energy gaps define the largest energy scale of the setup. A consequence of the constraints given in both Eq. (15a) and Eq. (15b) is that the dimensionality of the ground state subspace at zero charging energy decreases by a factor of two for all islands. In particular, for the four-terminal island 320, the four-fold degenerate ground state subspace at zero charging energy reduces to a two-fold degenerate ground state subspace which makes up the MSQ. The Pauli matrices acting on the each of the two MSQs are given by $$\hat{x}=i\gamma_2\gamma_3, \hat{y}=i\gamma_1\gamma_3, \hat{z}=i\gamma_2\gamma_1 \qquad (16)$$

As shown in FIG. 3A, the TSC island 320 and reference TSC island 330 are placed in parallel between two bulk, s-wave SC leads 310 m=L,R and are used to address the MSQs through tunable tunnel couplings. The BCS Hamiltonian of the SC leads 310 is given by Eq. (1), with the index m replacing the index $\ell$. For simplicity, the magnitudes of the SC order parameters are taken to be identical for both SC leads 310.

The tunneling Hamiltonians which couple the SC leads 310 to the MBSs at the terminal points 322, 334 are given by $$H_T = \sum_{m,\ell}\sum_{k,s} \lambda^s_{m\ell} c^\dagger_{m,ks}\gamma_\ell e^{-i\phi/2} + H.c., \qquad (17a)$$

$$H_{T,ref} = \sum_{m,\ell}\sum_{k,s} \lambda^s_{m\ell,ref} c^\dagger_{m,ks}\gamma_{\ell,ref} e^{-i\phi_{ref}/2} + H.c., \qquad (17b)$$

for the four-terminal island 320 and the two-terminal reference island 330, respectively. For simplicity, the tunnel couplings are taken to be point-like. This is justified provided that the separation between individual tunneling contacts is much smaller than the superconducting coherence length $\xi_{SC}$.

Below, the lead electrons are assumed to couple only to nearby MBSs, i.e., $\lambda_{L2}^S=\lambda_{L4}^S=\lambda_{R1}^S=\lambda_{R3}^S=0$ and $\lambda_{L2,ref}^S=\lambda_{R1,ref}^S=0$. This is justified if the MBS localization length $\xi_{MBS}$ is much shorter than the islands 320, 303. The remaining non-zero tunnel couplings are assumed to take on the most general complex and spin-dependent form. Couplings of the lead fermions to finite energy quasiparticles are neglected, which is justified if the energy gap of the TSC islands 320, 330 is sufficiently large. Moreover, the operators $e^{\pm i\varphi/2}$ and $e^{\pm i\varphi_{ref}/2}$ increase/decrease the total charge of the four-terminal island 320 or the two-terminal reference island 330 by one charge unit, $[n,e^{\pm i\varphi/2}]=\pm e^{\pm i\varphi/2}$ and $[n_{ref},e^{\pm i\varphi_{ref}/2}]=\pm e^{\pm i\varphi_{ref}/2}$, while the MBSs operators $\gamma_\ell$ and $\gamma_{\ell,ref}$ change the electron number parity of respective islands 320 and 330. In summary, the Hamiltonian for an MSQ experiment is given by $H=H_0+U+U_{ref}+H_T+H_{T,ref}$.

2.1 Single-Qubit Control

This section describes an MSQ experiment that allows for both read-out and manipulation of a single MSQ. In combination with the two-qubit entangling operation introduced further below, single-qubit read-out and manipulation enables universal quantum computation.

FIG. 3B illustrates a method 301 for rotations around the z-axis of the MSQ Bloch sphere as well as the read-out of the $\hat{z}$ eigenvalue. In this method 301, only the couplings 344 to the two-terminal reference island 330 and the two couplings 322a and 322b at opposite boundaries of the four-terminal island 320 are non-vanishing.

In this method 301, second-order processes in which a Cooper pair tunnels between one SC lead 310 and a TSC island 320, 330 are prohibited as a result of conflicting pairing symmetries assuming that couplings to finite-energy quasiparticles are negligible. Moreover, Cooper pair transport occurring separately between each SC lead 310 and both TSC islands 320, 330 is also forbidden, since these processes change the charge of the TSC islands 320, 330, and in this way leak out of the low-energy Hilbert space. Consequently, the Josephson coupling between the SC leads 310 is mediated exclusively by fourth-order co-tunneling processes via both the two-terminal 330 and the four-terminal island 340.

The method 301 of FIG. 3B is an example of such a fourth-order process. It involves extracting two electrons which form a Cooper pair from one of the SC leads 310a and placing them onto the two spatially separated islands in the first two steps as described above. To ensure that the Cooper pair splitting is coherent, the distance between the islands 320 and 330 is smaller than the superconducting coherence length $\xi_{SC}$ and leads to virtually excited states of order $U\equiv e^2/2C$ on both islands 320 and 330. In the final two steps, the Cooper pair is recombined on the other SC lead 310 as described above, and the system thereby returns to its ground state.

The amplitudes of all Cooper pair splitting processes can be computed perturbatively in the weak-tunneling limit, $$\pi v_m |\lambda^s_{m\ell,ref}\lambda^{s'}_{m\ell}| \ll \Delta, U$$

where $v_m$ is the normal-state density of states per spin of the lead m at the Fermi energy. The results are summarized by an effective Hamiltonian acting on the BCS ground states of the leads and the charge ground states of the islands, $$H_{z,eff}=(-1)^{n_{0,ref}+1}(J_{12}+\tilde{J}_{12})\cos(\varphi+\varphi_{12})\hat{z}, \qquad (18)$$

where contributions that are independent of the SC phase difference have been omitted as they do not contribute to the Josephson current. Equation (18) also includes the coupling constants and the anomalous phase shift, $$J_{ll'} = \frac{32|\Gamma_{Ll}\Gamma_{Rl'}|}{\pi^2\Delta} \int_1^\infty \frac{dxdy}{f(x)f(y)[f(x)+f(y)]g(x)g(y)}, \qquad (19)$$

$$\tilde{J}_{ll'} = \frac{64|\Gamma_{Ll}\Gamma_{Rl'}|}{\pi^2\Delta} \int_1^\infty \frac{dxdy}{f(x)f(y)[g(x)+g(y)]g(x)g(y)},$$

$$\varphi_{ll'} = \arg|\Gamma^*_{Ll}\Gamma_{Rl'}|,$$

with the functions $f(x)=\sqrt{1+x^2}$, $g(x)=\sqrt{1+x^2+U/\Delta}$ as well as the hybridization $$\Gamma_{ml}=\pi v_m(\lambda_{ml,ref}^\downarrow \lambda_{m\ell}^\uparrow - \lambda_{ml,ref}^\uparrow \lambda_{ml}^\downarrow).$$

There are at least three noteworthy aspects of the effective Hamiltonian given in Eq. (18). First, the unitary time-evolution operator of the effective Hamiltonian implements rotations around the z-axis of the MSQ Bloch sphere. More explicitly, by pulsing the couplings and phases of the effective Hamiltonian for a time $t_z$ such that $$(-1)^{n_{0,ref}+1}\int^{t_z}[J_{12}(t)+\tilde{J}_{12}(t)]\cos[\varphi(t)+\varphi_{12}(t)]=\hbar\theta_z/2$$

a rotation by an arbitrary angle $\theta_z$ around the z axis of the MSQ Bloch sphere is achieved.

Second, a choice of basis for the MSQ is given by the eigenstates of the $\hat{z}$-Pauli operator. Thus, a read-out of the MSQ in this basis amounts to measuring the eigenvalues $z=\pm 1$ of the $\hat{z}$-Pauli operator. This can be accomplished by measuring the sign of the resulting zero-temperature Josephson current, $$I = \frac{2e}{\hbar}(-1)^{n_{0,ref}}(J_{12}+\tilde{J}_{12})\sin(\varphi+\varphi_{12})z. \qquad (21)$$

For an odd (even) $n_{0,ref}$, a negative (positive) critical current implies that z=+1 while a positive (negative) critical currents implies that z=−1 as shown in FIG. 3A.

Third, for a non-zero effective Hamiltonian, $\Gamma_{1L} \neq 0$ and $\Gamma_{2R} \neq 0$. These conditions are fulfilled granted that the MBSs in the two islands couple asymmetrically to the two spin-species of the SC leads. In fact, the strength of the Josephson coupling is higher if the MBSs in different islands 320, 330 couple to opposite spin species in the SC leads 310.

For parallel topological nanowires coupled by a common mesoscopic superconductor, there are many ways to realize the desired asymmetry: One option is to have a common spin polarization in the two nanowires and a finite spin-orbit coupling in the tunneling barriers which rotates the spin. To see how, consider the (qubit) TSC island 320. In a first step, each horizontal segment of the TSC island (between terminals 322a and 322b and terminals 322c and 322d) is realized by a single semiconducting InAs nanowire that is made superconducting by covering it with an Al shell. In a second step, the two Al shells are again connected along the TSC island 320 by an Al superconductor to realize a "single shell" that connects to both InAs nanowires. By adjusting the tunneling barrier lengths, it is possible to transport a Cooper pair across the junction by pure spin-flip tunneling in the barriers 344 to the reference island 330 and pure normal tunneling in the barriers 342 to the four-terminal island 320. An alternative is to generate different (e.g., opposite) spin polarization in the two nanowires by using local magnetic fields. Such fields could be obtained by coating the wires with ferromagnets that produce different exchange fields.

FIG. 3C illustrates rotations around the x axis of the MSQ Bloch sphere. In this rotation process 302, the non-zero tunnel couplings are 342b, 342c, 344a, and 344b. The Josephson coupling between the superconducting leads 310 is again facilitated solely by Cooper pair splitting processes via the TSC islands 320 and 330. In the weak tunneling limit, the amplitudes of these Cooper pair splitting processes are summarized by an effective Hamiltonian acting on the BCS ground states of the SC leads 310 and the charge ground states of the islands 320 and 330, $$H_{x,eff} = (-1)^{n0,ref+1}(J_{32}+\tilde{J}_{32})\cos(\varphi+\varphi_{32})\hat{x}, \quad (22)$$

Pulsing the couplings and phases of this effective Hamiltonian for a time $t_x$ such that $$(-1)^{n0,ref+1}\int^{t_x}[J_{32}(t)+\tilde{J}_{32}(t)]\cos[\varphi(t)+\varphi_{32}(t)] = \hbar\Theta_x/2$$

enables rotations by an angle $\Theta_x$ around the x-axis of the MSQ Bloch sphere. Combining this observation with the results of Eq. (18) enables rotations around two independent axes on the Bloch sphere and, therefore, enables the implementation of arbitrary single-qubit gates acting on the MSQ.

2.2 Two-Qubit Gates

FIGS. 4A and 4B illustrate how SC leads 310, four-terminal TSC islands 320, and two-terminal reference TSC islands 330 can be used to implement a two-qubit entangling gate. FIG. 4A shows a two-qubit gate 400 with two four-terminal islands 320a and 320b (j=a,b). Together, these islands 320a and 320b have four non-zero tunnel couplings (indicated by arrows numbers 1, 2, 3, and 4). The other tunnel couplings are set to zero. The numbered arrows indicate two Cooper pair splitting processes which lead to a Josephson coupling between the superconducting leads 310. Each process involves splitting a single Cooper pair, with one electron from the Cooper pair transiting each island 320, 330.

In these processes, the lower left terminal of each island 320a, 320b receives an electron from the first SC lead 310a and the upper right terminal of each island 320a, 320b transfers an electron to the second SC lead 310b. Eq. (23) gives the sum of the amplitudes of the Cooper pair splitting processes that allow a Cooper pair to move between the two superconducting leads 310 via the TSC islands 320 and 330. Put differently, Eq. (23) gives an effective Hamiltonian which acts on the BCS ground states and the charge ground states of the TSC islands 320a and 320b, $$H_{eff} = (J+\tilde{J})\cos(\varphi+\varphi_0)\hat{x}_a\hat{x}_b. \quad (23)$$

Equation (24) includes coupling constants and an anomalous phase shift, $$J = \frac{32|\Gamma'_{L3}\Gamma'_{R2}|}{\pi^2\Delta}\int_1^\infty \frac{dxdy}{f(x)f(y)[f(x)+f(y)]g(x)g(y)}, \quad (24)$$

$$\tilde{J} = \frac{64|\Gamma'_{L3}\Gamma'_{R2}|}{\pi^2\Delta}\int_1^\infty \frac{dxdy}{f(x)f(y)[g(x)+g(y)]g(x)g(y)},$$

$$\varphi_0 = \arg[(\Gamma'_{L3})*\Gamma'_{R2}].$$

Equation (24) includes the hybridization:

$$\Gamma'_{m\Theta} = \pi\nu_m(\lambda_{ml,b}^\downarrow \lambda_{ml,a}^\uparrow - \lambda_{ml,b}^\uparrow \lambda_{ml,a}^\downarrow). \quad (25)$$

The effective Hamiltonian in Eq. (23) shows that by pulsing the couplings and phases for a time $\tau$ such that $$\int^\tau [J(t) \mp \tilde{J}(t)]\cos[\phi(t)+\phi_0(t)] = \hbar\chi,$$

the unitary time-evolution operator of the effective Hamiltonian implements an $XX_\chi \equiv \exp(-i\chi\hat{x}_a\hat{x}_b)$ gate for some parameter $\chi$. The $XX_{\pi/4}$-gate together single-qubit operations implements a CNOT gate, $$CNOT = X_{-\frac{\pi}{2},b} \cdot Y_{-\frac{\pi}{2},a} \cdot X_{-\frac{\pi}{2},a} \cdot XX_{\frac{\pi}{4}} \cdot Y_{\frac{\pi}{2},a}, \quad (26)$$

with the single-qubit gates $X_{\theta,j} \equiv \exp(-i\theta\hat{x}_j/2)$ and $Y_{\theta,j} \equiv \exp(-i\theta\hat{y}_j/2)$ for some parameter $\theta$. The CNOT-gate defined in Eq. (26) uses the MSQ a as control and the MSQ b as target. A CNOT'-gate in which the roles of control and target-qubit are reversed can readily be obtained by applying single-qubit Hadamard gates, $CNOT'=H_a \cdot H_b \cdot CNOT \cdot H_a \cdot H_b$ with $H_\ell = (\hat{x}_\ell + \hat{z}_\ell)/\sqrt{2}$. The combination of the single-qubit gates introduced in the previous section together with the two-qubit CNOT gate is sufficient for universal quantum computation with MSQs.

FIG. 4B shows a scalable MSQ computer 402 made of unit cells 404, each of which is comprised of two four-terminal islands 320 and a single reference island 330 in parallel between SC leads 310. This enables the implementation of a universal gate set comprised of arbitrary single-qubits gates (one four-terminal island and the reference island) and a two-qubit entangling gate (two four-terminal islands) within each unit cell 404. Such a unit cell 404 can readily be scaled to a linear array of multiple unit cells 404 as depicted in FIG. 4B. The distance between the individual unit cells 402 in such an array is taken to be at most of the order of the superconducting coherence length $\xi_{SC}$ which is on the order of 1000 nm for pure Al (impure Al may have a shorter superconducting coherence length). The coherent exchange of quantum information between different unit cells 404 is facilitated by SWAP gates, which can be realized by applying multiple CNOT gates, acting on MSQs of neighbouring unit cells 404.

3 Distinguishing Majorana and Andreev Bound States with a Cooper Transistor

Topological superconductors (TSCs) hosting spatially separated Majorana bound states (MBSs) form a key component of robust quantum computing architectures. Proposed realizations of TSCs comprise superconductor (SC)-semiconductor nanowires under strong magnetic fields, magnetic atom chains on a SC as well as vortex cores in SC-topological insulator devices. Most notably, in these platforms, the emergence of a zero-bias conductance peak has been perceived as a first step towards verifying the existence of MBSs. However, a zero-bias conductance peak measurement cannot readily distinguish a zero-energy MBS from a zero-energy Andreev bound state (ABS), which can also appear in the systems listed above.

In this context, an ABS is a fermionic state with energy smaller than the superconducting gap of a TSC island and whose quantum mechanical wave function is localized at one of the TSC island's terminal points. More specifically, the ABS resides close to or even at zero energy, thereby mimicking a MBS, which also appears at zero energy. Mathematically, a single ABS can be thought of as two MBSs at the same spatial location. Majorana superconducting qubits function with MBSs, but not ABSs, which may accidentally (for example, by fine tuning system parameters) occur in a TSC island.

Figure 5A:
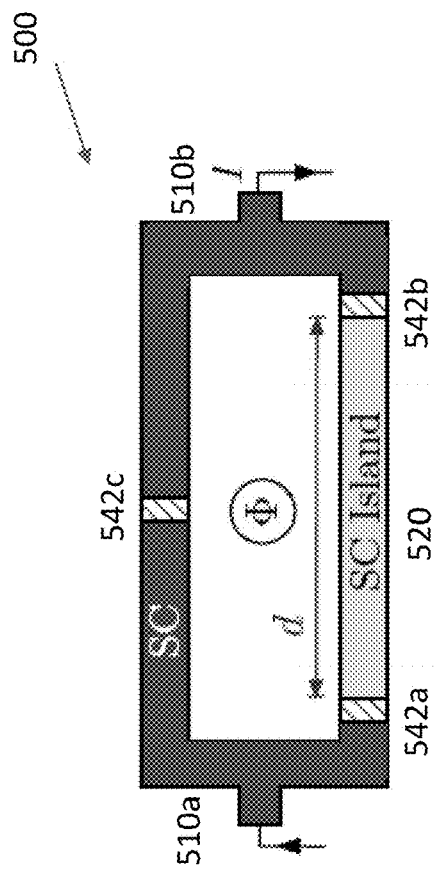
FIG. 5A shows a Cooper pair transistor (CPT) realized by a mesoscopic SC island of length d that weakly couples to a pair of s-wave SC leads, which also couple directly to each other forming a superconducting quantum interference device (SQUID) loop with magnetic flux $\Phi$.

Fortunately, a Cooper pair transistor (CPT) can be discriminate between MBSs and ABSs. FIG. 5A shows a CPT 501 realized by a mesoscopic SC island 520 coupled to s-wave SC leads 510a and 510b. In the absence of quasiparticle poisoning, shown in FIG. 5B, the supercurrent across the CPT 500 exhibits a characteristic 2e-periodicity in the island-gate charge.

Figure 5B:
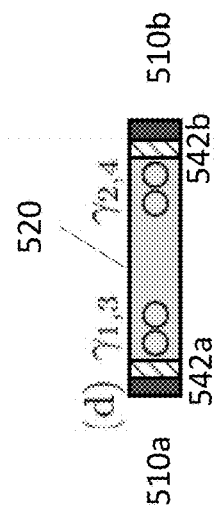
FIG. 5B shows a basic CPT.
Figure 5C:
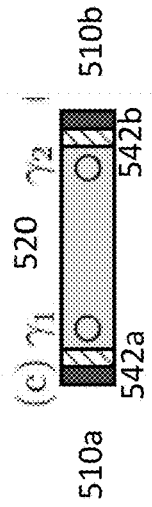
FIG. 5C shows a Majorana superconducting transistor (MST) with two spatially separated Majorana bound states (MBSs) $\gamma_1, \gamma_2$.
Figure 5D:
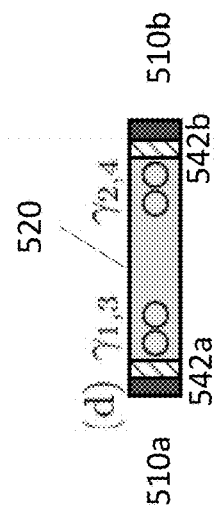
FIG. 5D shows an Andreev superconducting transistor (AST) with two spatially separated Andreev bound states (ABSs) that are decomposable into four MBSs $\gamma_1, \gamma_2, \gamma_3, \gamma_4$.

The CPT 500 can be configured as a Majorana superconducting transistor (MST), shown in FIG. 5C, with the SC island 520 hosting hosts two spatially separated MBSs one at either end of the SC island 520. The CPT 500 can also be configured as an Andreev superconducting transistor (AST), shown in FIG. 5D, where the SC island 520 hosts two spatially separated ABSs—again, one at either end of the SC island 520. Each ABS can be decomposed into two MBSs. For a CPT 500 with an SC island 520 realized as hybrid InAs/Al nanowires, applying a strong magnetic field should drive the system into the topological MST phase. However, a strong magnetic field could drive the CPT 500 into an AST configuration if, for example, the confinement potential is smooth. The measurement disclosed here can be used to rule out this "accidental" AST case.

For both configurations, the magnitude of the critical supercurrent exhibits a characteristic 1e-periodicity in the island-gate charge provided that the MBSs or the ABSs reside close to zero energy. While this signature discriminates the trivial, un-poisoned CPT from both the MST and the AST, the MST and the AST are also distinguishable among themselves: For the AST, the current-phase relation reverses its sign when the parity of the island-ground state charge changes between even and odd. In contrast, the MST shows no such sign reversal.

Our findings highlight the significance of measuring the full current-phase relation in the MST or AST for understanding the nature of zero energy bound states in TSC candidate systems. In addition, the concept of the MST provides a first step towards integrating a Majorana qubit in an all-superconducting circuit. Such an integration is attractive as it promises improved protection from quasiparticle poisoning due to the finite SC gap in the circuit and may, therefore, constitute a viable platform for Majorana-based quantum computing.

3.1 A Cooper Pair Transistor (CPT)

In FIG. 5A, the CPT 500 is realized by a mesoscopic SC island 520 that connects to ground via a capacitor and weakly couples to a pair of s-wave SC leads 510a and 510b via respective tunable tunneling barriers 542a and 542b. The two SC leads 510a and 510b also couple directly to each other via another tunable tunneling barrier 542c to form a superconducting quantum interference device (SQUID). Again, the SC leads 510 can be described in terms of the BCS Hamiltonian in Eq. (1), with the index m replacing the index ℓ for consonance with the following equations. Again, the SC leads 510 are taken to have identical SC gaps.

Since the SC island 520 is of mesoscopic size, it acquires the charging energy given in Eq. (3). This charging energy is high enough to suppress extrinsic quasiparticle poisoning. The gate charge can be tuned continuously via a gate voltage $V_g$ across a capacitor with capacitance C. The SC island can operate in the MST regime and the AST regime.

In the MST regime, which is depicted in FIG. 5B, the SC island 520 hosts two MBSs $\gamma_1$, $\gamma_2$ at opposite terminal points. If the length d of the SC island 520 is comparable to the MBS localization length, the two MBSs $\gamma_1$, $\gamma_2$ acquire a finite energy splitting $\varepsilon_{12}$. This energy splitting can be modeled by the Hamiltonian, $$H_{MBS} = i\varepsilon_{12}\gamma_1\gamma_2 \tag{27}$$

By tuning the gate charge $Q/e$ so that the SC island hosts $n_0$ electron charges in its ground state, the total fermion parity of the SC island obeys $$i\gamma_1\gamma_2 = (-1)^{n_0} \tag{28}$$

For well-separated MBSs, $\varepsilon_{12}=0$, so this constraint reduces the two-fold degenerate ground state at zero charging energy to a non-degenerate ground state.

In the AST regime, which is shown in FIG. 5C, the SC island 520 hosts two ABSs at opposite terminal points whose field operators are decomposable into four MBSs $\gamma_1$, $\gamma_2$, $\gamma_3$, $\gamma_4$ in total. The coupling between the four MBSs can be modeled by the Hamiltonian, $$H_{ABS} = i\sum_{i<j}\varepsilon_{ij}\gamma_i\gamma_j. \tag{29}$$

Here, $\varepsilon_{ij}$ are coupling constants. Similar to the topological regime, the gate charge $Q/e$ can be tuned so that the SC island 520 hosts $n_0$ electron charges in its ground state. The total fermion parity then satisfies, $$i\gamma_1\gamma_2\gamma_3\gamma_4 = (-1)^{n_0} \tag{30}$$

For zero-energy ABSs, $\varepsilon_{ij}=0$, this constraint reduces the four-fold degeneracy of the ground state at zero charging energy to a two-fold degeneracy.

Next, couple the SC leads 510 to the MBSs on the SC island 520. The tunneling Hamiltonian is, $$H_T = \sum_{m,i}\sum_{k,s}\lambda_{mi}^s c_{m,ks}^\dagger \gamma_i e^{-i\phi/2} + H.c. \tag{31}$$

Here, the point-like and complex tunneling amplitudes $\lambda_{mi}^S$ couple the lead fermions in the m-SC to the MBSs $\gamma_i$ where i=1, 2 for the MST and i=1, . . . , 4 for the AST. Notably, the lead fermions couple to all MBSs due to the finite length d of the SC island 520. In addition, the operators $\exp(\pm i\varphi/2)$ increase/decrease the total charge of the SC island by one unit, $[n, \exp(\pm i\varphi/2)] = \pm \exp(\pm i\varphi/2)$ while the MBS operators $\gamma_i$ flip the number parity. Lastly, couplings to above-gap quasiparticles in the SC island are negligible assuming a sufficiently large SC gap in the SC island 520. Such a large SC gap with no subgap conductance is conceivable in semiconductor nanowires or two-dimensional electron gases proximitized by an Al/NbTi/NbTiN multilayer SC.

The SC leads 510 are connected directly to each other via a conventional tunneling barrier 542c, which can be described by the tunneling Hamiltonian, $$H_{T,ref} = \sum_{k,s} \lambda_{ref} e^{i\pi\Phi/\Phi_0} c^\dagger_{L,ks} c_{R,ks} + H.c. \tag{32}$$

Here, for simplicity, the point-like tunneling amplitude $\lambda_{ref}$ is taken to be real and spin-independent. Moreover, $\Phi$ denotes a flux piercing through the SQUID-loop and $\Phi_0 = e/2h$ is the flux quantum. The tunneling is assumed to be spin-conserving.

In summary, the full Hamiltonian for the MST is given by $H = H_{SC} + U_C(n) + H_{MBS} + H_T + H_{T,ref}$ and for the AST by $H' = H_{SC} + U_C(n) + H_{ABS} + H_T + H_{T,ref}$.

3.2 Supercurrent in the MST Regime

In the MST regime (FIG. 5C), the MBSs on the MST can mediate Cooper pair tunneling that leads to supercurrent flux between the SC leads. To see how, consider the nearly-zero-energy MBSs, $\varepsilon_{12} \ll \Delta$, C with $U \equiv e^2/2C$, which is relevant for qubit applications.

To second order in the tunneling amplitudes $\lambda_{mi}^S$, the energy gap $\Delta$ of the SC leads 510 suppresses single-electron transfer across the SC island 520. Similarly, the charging energy U of the SC island 520 suppresses Cooper pair transfer between each SC lead 510a, 510b and the SC island 520. Consequently, no Josephson coupling between the SC leads 510 arises from second-order processes in the tunneling amplitudes $\lambda_{mi}^S$.

Next, consider fourth-order sequences in the tunneling amplitudes $\lambda_{mi}^S$. Here, the sequences that generate a finite Josephson coupling involve a Cooper pair moving between the SC leads 510 by tunneling in and out of the SC island 520 via the spatially separated MBSs $\gamma_1$ and $\gamma_2$. These sequences are proportional to $(\gamma_1 \gamma_2)^2 = 1$ and are therefore independent of the total fermion parity of the SC island 520.

The amplitudes of the relevant sequences in the weak coupling limit can be represented by an effective Hamiltonian, $$H_{eff} = -J_{ref} \cos \varphi_{ref} - J \cos \varphi, \tag{33}$$

which neglects contributions that are independent of the SC phases and do not add to the supercurrent.

The first term in the effective Hamiltonian in Eq. (33) describes the Josephson junction that directly couples the two SC leads 510. Here, $J_{ref} \sim \lambda_{ref}^2 / \Delta$ is the corresponding Josephson coupling and $\varphi_{ref} = \varphi_L - \varphi_R - 2\pi\Phi/\Phi_0$ is the phase drop across the junction. The second term in Eq. (33) captures the indirect coupling of the SC leads 510 through the SC island 520. Here, $J \neq 0$ provided that $|\Gamma_{12}^L \Gamma_{12}^R| \neq 0$ where $\Gamma_{ij}^m = \pi v_m (\lambda_{mi}^\downarrow \lambda_{mj}^\uparrow - \lambda_{mi}^\uparrow \lambda_{mj}^\downarrow)$ is the hybridization between the m-SC and the MBSs $\gamma_i$, $\gamma_j$. Lastly, the phase drop in the second term of the effective Hamiltonian is $\varphi = \varphi_L - \varphi_R + \varphi_0$ where $\varphi_0$ is an anomalous phase shift that arises from the complex tunneling amplitudes $\lambda_{mi}^S$.

The resulting supercurrent is given by $$I = I_{ref,0} \sin \varphi_{ref} + I_0 \sin \varphi, \tag{34}$$

where $I_{ref,0} = 2eJ_{ref}/\hbar$ and $I_0 = 2eJ/\hbar$. The current-phase relation of Eq. (34) is measurable through the flux-dependence the critical supercurrent, $I_C = \max_\varphi [I]$. For a highly-asymmetric SQUID, $I_{ref,0} \gg I_0$, the critical supercurrent is:

$$I_c = I_{ref,0} + I_0 \cos\left(\frac{2\pi\Phi}{\Phi_0} + \varphi_0\right). \tag{35}$$

This expression for the critical supercurrent depends on two tuning parameters: (1) the island-gate charge $Q$ entering as a result of virtual transitions to excited charge states and (2) the magnetic flux $\Phi$ threading the SQUID loop FIG. 2A is a plot of the critical supercurrent passing through an MST versus the island-gate charge for the case of zero energy splitting between the MBSs. The supercurrent is 1e-periodic in the island-gate charge, not 2e-periodic as for a trivial CPT. The critical supercurrent is also independent of the total fermion parity $(-1)^{n_0}$ on the SC island. This 1e-periodicity arises because the replacements $Q \to Q + e$, $n_0 \to n_0 + 1$ leave the charging energy and, hence, the Josephson coupling J invariant. This 1e-periodicity of the critical supercurrent does not carry over from the MST to the AST as explained below.

The 1e-periodicity of the critical supercurrent constitutes a sharp deviation from the 2e-periodicity which, in the absence of quasiparticle poisoning, appears for a trivial CPT. Also, unlike in a trivial CPT, no above-gap quasiparticles need to be accessible in the SC island 520 for a finite supercurrent.

Any finite MBS energy splitting, $\varepsilon_{12} \neq 0$, lifts the 1e-periodicity of the supercurrent because the Josephson couplings for even and odd charge states acquire different energy denominators. This means that the deviation from perfect 1e-periodicity can be used to estimate the MBS energy splitting $\varepsilon_{12}$.

Returning to Eq. (34), the second tuning parameter in the critical supercurrent is the magnetic flux $\Phi$ threading the SQUID loop. FIG. 6B is a plot of the magnetic flux-dependence of the critical supercurrent. It shows that the current-phase relation is independent of the total fermion parity $(-1)^{n_0}$ on the SC island 520. This feature does not carry over from the MST in FIG. 5C to the AST in FIG. 5D.

The observation of a finite supercurrent across the SC island 520 implies finite local and non-local couplings between the SC leads 510 and the MBSs at the ends of the SC island 520. As the non-local couplings are exponentially suppressed in the length d of the SC island 520, one might question if the above-described features of the supercurrent are measurable. Fortunately, measuring small currents does not pose an experimental challenge because they can be measured using longer measurement times. Indeed, for a nanowire CPT subject to a magnetic field recent experiments observed a transition from a 2e- to a 1e-peak spacing in the magnitude of the switching current versus island-gate charge. This transition can arise as a result of nearly-zero-energy MBSs or nearly-zero-energy ABSs as explained below.

3.3 Supercurrent in the AST Regime

In the AST regime (FIG. 5D), two ABSs, or equivalently four MBSs $\gamma_1$, $\gamma_2$, $\gamma_3$, $\gamma_4$ mediate the Cooper pair transport between the SC leads 510 that yields supercurrent for the AST. Again, focus on the limit of nearly-zero-energy ABSs, $\varepsilon_{ij} \ll \Delta, U$. This limit should be distinguished from the MST for qubit applications.

The local couplings $\lambda_{L1(3)}^S$ and $\lambda_{R2(4)}^S$ between the ABSs and the lead electrons induce the dominant contribution to the supercurrent. As a result, the supercurrent for the AST should be exponentially larger than the supercurrent for the MST, where a finite supercurrent involves finite non-local couplings. Notably, non-local couplings are also present for the AST but produce a contribution that is considerably weaker and should not qualitatively alter results. For now, consider the other local couplings to be zero, i.e., $\lambda_{L2(4)}^S = \lambda_{R1(3)}^S = 0$.

For the same as reasons as in the MST regime, the second-order sequences in the tunneling amplitudes $\lambda_{mi}^S$ do not contribute to the supercurrent. Consequently, the lowest-order contribution may appear only in fourth-order of perturbation theory. In such a fourth-order sequence, a Cooper pair moves between the two SC leads 510 by tunneling in and out of the two ABSs, or equivalently the four MBSs, at the ends of the SC island 520. Notably, such sequences involve all four MBSs on the SC island 520 and, hence, depend on the total fermion parity of the SC island through Eq. (30).

The amplitudes of the relevant sequences perturbatively in the weak-coupling limit can be summarized by an effective Hamiltonian, $$H'_{eff} = -J_{ref} \cos \varphi_{ref} - J'(\gamma_1 \gamma_2 \gamma_3 \gamma_4) \cos \varphi'. \tag{36}$$

Here, for the Josephson junction which indirectly couples the SC leads via the SC island, the phase drop $\varphi' = \varphi_L - \varphi_R + \varphi'_0$ where $\varphi'_0$ is an anomalous phase shift that results because the tunneling amplitudes $\lambda_{mi}^S$ are complex numbers. $J' \neq 0$ as long as $|\Gamma_{13}^L \Gamma_{24}^R| \neq 0$. The resulting supercurrent is $$I' = I_{ref,0} \sin \varphi_{ref} + (-1)^{n_0} I'_0 \sin \varphi', \tag{37}$$

where $I'_0 = 2eJ'/\hbar$. The current-phase relation of the supercurrent with the critical current can be measured through a highly asymmetric SQUID, $I_{ref,0} \gg I'_0$. This yields the critical supercurrent:

$$I'_c = I_{ref,0} + (-1)^{n_0} I'_0 \cos\left(\frac{2\pi\Phi}{\Phi_0} + \varphi_0\right). \tag{38}$$

The critical supercurrent depends on two parameters: (1) the island-gate charge Q and (2) the magnetic flux $\Phi$.

FIG. 6C shows the island-gate charge Q for zero-energy ABSs, $\varepsilon_{ij} = 0$. Here, the magnitude of the critical supercurrent is still 1e-periodic in the gate charge $Q$. This behavior is identical to the MST regime and, therefore, does not enable a distinction between nearly-zero-energy ABSs and MBSs. However, because the supercurrent depends on the total fermion parity $(-1)^{n_0}$ of the SC island 520, the sign of the critical supercurrent reverses when the gate charge is tuned from $Q$ to $Q$ uek. This sign reversal is also visible in the dependence on the magnetic flux $\Phi$, shown in FIG. 6D. This sign reversal did not show up for an MST, so it can be used to distinguish the MST from the AST.

The calculations above for the AST the supercurrent across the SC island 520 involves only contributions that are parity-dependent. This is an outcome of the assumption of purely local couplings between the ABSs on the SC island 520 and the fermions in the SC leads 510. Including non-local couplings, as for the MST, may introduce parity-independent contributions. These parity-independent contributions occur when a Cooper pair moves between the SC leads 510 by tunneling in and out via the same ABSs or, equivalently, the same two MBSs. However, these non-local contributions are significantly smaller in magnitude than the local contributions. As a result, it is unlikely that non-local contributions would overwhelm the sign reversal of the supercurrent that arises due to the local contributions.

4 Conclusion

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize or be able to ascertain, using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. A Majorana superconducting device comprising:
   a first superconducting lead;
   a second superconducting lead;
   a topological superconductor (TSC) island, disposed between the first superconducting lead and the second superconducting lead, having a first terminal to host a first Majorana bound state coupled to the first superconducting lead and a second terminal to host a second Majorana bound state coupled to the second superconducting lead; and
   a TSC reference island, disposed between the first superconducting lead and the second superconducting lead, having a first reference terminal to host a first reference Majorana bound state coupled to the first superconducting lead and a second reference terminal to host a second reference Majorana bound state coupled to the second superconducting lead; and
   a measurement device, operably coupled to the first superconducting lead and the second superconducting lead, to measure a sign of a supercurrent traveling through the TSC island and the TSC reference island, the sign of the supercurrent indicating a joint parity of the first Majorana bound state, the second Majorana bound state, the first reference Majorana bound state, and the second reference Majorana bound state.

2. The Majorana superconducting device of claim 1, wherein the TSC island and the TSC reference island are separated by a distance that is (i) less than or equal to a superconducting coherence length of the first superconducting lead and (ii) less than or equal to a superconducting coherence length of the second superconducting lead.

3. The Majorana superconducting device of claim 1, wherein the TSC island has a third terminal to host a third Majorana bound state and a fourth terminal to host a fourth Majorana bound state.

4. The Majorana superconducting device of claim 1, wherein the TSC island has a length that is greater than (i) a localization length of the first Majorana bound state, (ii) a localization length of the second Majorana bound state, (iii) a localization length of the first reference Majorana bound state, and (iv) a localization length of the second reference Majorana bound state.

5. The Majorana superconducting device of claim 1, wherein the TSC reference island has a length that is greater than (i) a localization length of the first reference Majorana bound state and (ii) a localization length of the second reference Majorana bound state.

6. The Majorana superconducting device of claim 1, wherein the TSC island is one of a plurality of TSC islands disposed between the first superconducting lead and the second superconducting lead.

7. The Majorana superconducting device of claim 1, further comprising:
   a first tunable tunneling barrier coupling the first superconducting lead to the first end of the TSC island; and
   a second tunable tunneling barrier coupling the second superconducting lead to the second end of the TSC island, to transmit the supercurrent from the first superconducting lead to the second superconducting lead via the first tunable tunneling barrier and the TSC island.

8. A method of operating a Majorana superconducting device comprising a topological semiconductor (TSC) island and a TSC reference island disposed in parallel between a first superconducting lead and a second superconducting lead, the method comprising:
   transmitting a supercurrent from the first superconducting lead to the second superconducting lead via the TSC island and the TSC reference island; and
   measuring a sign of the supercurrent, the sign of the supercurrent indicating a joint parity of a first Majorana bound state at a first terminal of the TSC island, a second Majorana bound state at a second terminal of the TSC island, a first reference Majorana bound state at a first reference terminal of the TSC island, and a second reference Majorana bound state at a second reference terminal of the TSC island.

9. The method of claim 8, wherein transmitting the supercurrent comprises:
- actuating a first tunable tunneling barrier coupling the first end of the TSC island to the first superconducting lead; and
- actuating a second tunable tunneling barrier coupling the second end of the TSC island to the second superconducting lead.

10. The method of claim 8, further comprising:
- splitting a Cooper pair from the first superconducting lead into a first electron and a second electron;
- coupling the first electron to the first terminal of the TSC island; and
- coupling the second electron to the first reference terminal of the TSC reference island.

11. The method of claim 10, further comprising:
- coupling the first electron from the TSC island to the second superconducting lead;
- coupling the second electron from the TSC reference island the second superconducting lead; and
- re-forming the Cooper pair from the first electron and the second electron at the second superconducting lead.

* * * * *